United States Patent
Lee et al.

(10) Patent No.: US 10,630,332 B2
(45) Date of Patent: Apr. 21, 2020

(54) ELECTRONIC DEVICE

(71) Applicant: LG ELECTRONICS INC., Seoul (KR)

(72) Inventors: Seungyoon Lee, Seoul (KR); Hyunsun Yoo, Seoul (KR); Minhyuck Choi, Seoul (KR); Jaebeom Cho, Seoul (KR); Joongyeol Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 248 days.

(21) Appl. No.: 15/577,514

(22) PCT Filed: Aug. 7, 2015

(86) PCT No.: PCT/KR2015/008291
§ 371 (c)(1),
(2) Date: Nov. 28, 2017

(87) PCT Pub. No.: WO2017/014350
PCT Pub. Date: Jan. 26, 2017

(65) Prior Publication Data
US 2018/0152213 A1 May 31, 2018

(30) Foreign Application Priority Data

Jul. 22, 2015 (KR) .................. 10-2015-0103754
Jul. 28, 2015 (KR) .................. 10-2015-0106370

(51) Int. Cl.
*H04R 25/00* (2006.01)
*H04B 1/3827* (2015.01)
(Continued)

(52) U.S. Cl.
CPC ............ *H04B 1/385* (2013.01); *H01L 43/04* (2013.01); *H04R 1/1091* (2013.01);
(Continued)

(58) Field of Classification Search
CPC .......... H04R 25/00; H04R 5/033; H04R 1/10; H04R 1/05; H04R 19/04
See application file for complete search history.

(56) References Cited

U.S. PATENT DOCUMENTS

| 8,170,261 B2* | 5/2012 | Danielson ............ H04R 1/1008 381/374 |
| 2007/0060209 A1 | 3/2007 | Medhin |
| 2010/0189303 A1 | 7/2010 | Danielson et al. |

FOREIGN PATENT DOCUMENTS

| JP | 10-23586 A | 1/1998 |
| KR | 10-1295046 B1 | 8/2013 |
| KR | 10-2015-0063328 A | 6/2015 |

* cited by examiner

*Primary Examiner* — Amir H Etesam
(74) *Attorney, Agent, or Firm* — Birch, Stewart, Kolasch & Birch, LLP

(57) ABSTRACT

An electronic device comprises a middle housing; a frame including a first frame and a second frame, each of which have one end respectively coupled to both the left and right sides of the middle housing; a body housing coupled to the frame such that electronic parts are loaded therein; and a frame adjusting part for adjusting an angle between the first frame and the second frame or an arrangement thereof. The electronic device includes the frame adjusting part capable of changing the angle of a band hung around the neck of changing the angle of a band hung around the neck of a user, and thus is conveniently removed and can be stably fixed when worn.

19 Claims, 23 Drawing Sheets

(51) Int. Cl.
*H04R 5/033* (2006.01)
*H01L 43/04* (2006.01)
*H04R 1/10* (2006.01)

(52) U.S. Cl.
CPC ... *H04R 5/0335* (2013.01); *H04B 2001/3872* (2013.01); *H04R 1/1016* (2013.01); *H04R 1/1033* (2013.01); *H04R 1/1041* (2013.01); *H04R 5/033* (2013.01); *H04R 2201/107* (2013.01); *H04R 2420/07* (2013.01)

(a)

(b)

(a)

(b)

(a)

(b)

(a)

(b)

(c)

(a)

(b)

(a)

(b)

(a)

(b)

(a)

(b)

(a)

(b)

(a)

(b)

ELECTRONIC DEVICE

CROSS REFERENCE TO RELATED APPLICATIONS

This application is the National Phase of PCT International Application No. PCT/KR2015/008291, filed on Aug. 7, 2015, which claims priority under 35 U.S.C. 119(a) to Patent Application No. 10-2015-0103754, filed in Republic of Korea on Jul. 22, 2015, and Patent Application No. 10-2015-0106379, filed in Republic of Korea on Jul. 28, 2015, all of which are hereby expressly incorporated by reference into the present application.

TECHNICAL FIELD

The present invention relates to an electronic device that includes a band worn on a neck of a user.

BACKGROUND ART

An electronic device may perform functions such as music play and phone call by using various electronic components provided in a housing. The electronic device may have a phone call by being connected with a base station or obtain audio data by directly accessing an external server, and may perform the above functions through pairing with another terminal.

The electronic device may include a wireless communication unit and an audio output unit, and there are increasing demands for an electronic device of a wireless communication scheme in view of mobility and convenience in use. An electronic device, with which a user may carry by gripping with a hand, having a design considering portability is being developed. Such an electronic device having the design considering portability includes a headphone type wearable on a user's head in a band shape, an ear hook type and an ear insertion type.

Recently, there are demands for an electronic device having a band that may be worn on a neck of a user to allow the user to easily carry it even in a state that the user does not wear a receiver on his/her ears. Since the electronic device is worn on a neck of a user even in a state that the user does not use the electronic device actually, it is required to improve wearing of the electronic device. Particularly, since neck sizes are different depending on users, there are needs for bands customized for the users.

DISCLOSURE

Technical Problem

An object of the present invention devised to solve the aforementioned problem of the related art is to provide an electronic device comprising, a frame control unit for controlling an angle between two frames to change an angle of a band.

Technical Solution

An electronic device comprises a middle housing; a frame including a first frame and a second frame respectively coupled to both sides of the middle housing; a main body housing coupled to the frame, in which electronic components are packaged; and a frame control unit for controlling an angle or arrangement between the first frame and the second frame.

The frame control unit may include a first rack gear extended from one end of the first frame and provided with a plurality of sawteeth, a second rack gear extended from one end of the second frame and provided with a plurality of sawteeth, and a gear module for controlling the first rack gear and the second rack gear to move the second rack gear symmetrically with the first rack gear when the first rack gear moves.

The gear module may include a first pinion gear having a plurality of sawteeth engaged with sawteeth of the first rack gear, rotated when the first rack gear moves, and a second pinion gear having a plurality of sawteeth engaged with sawteeth of the second rack gear, rotated when the second rack gear moves.

The electronic device may further comprise a spur gear interposed between the first pinion gear and the second pinion gear and rotated to be engaged with the first pinion gear and the second pinion gear, wherein the first rack gear may be arranged below the first pinion gear, and the second rack gear may be arranged above the second pinion gear.

The first pinion gear and the second pinion gear may include a drive gear rotated to be engaged with the first rack gear and the second rack gear, and a power transmission gear rotated based on the same shaft as that of the drive gear and rotated to be engaged with the spur gear.

The power transmission gear has a diameter greater than that of the drive gear, and the first rack gear and the second rack gear may be arranged between the first pinion gear and the second pinion gear.

The electronic device may further comprise a first elastic member applying a force to the first frame in an outward direction of the middle housing; and a stopper engaged with the sawteeth of the first pinion gear to restrict rotation, moving the first frame by means of the first elastic member if the first frame is spaced apart from the first pinion gear.

The electronic device may further comprise a second elastic member providing an elastic force applied to the stopper such that the stopper is hung in the sawteeth of the first pinion gear; and a restoring button applying a force to the stopper in an opposite direction of the elastic force of the second elastic member if it is pushed by a user.

The first pinion gear and the second pillion gear may be arranged in parallel at both sides and rotated in opposite directions by being engaged with each other, and the first rack gear and the second rack gear may be arranged in the same position above or below the first pinion gear and the second pinion gear.

The first pinion gear and the second pinion gear may be rotated together based on the same shaft.

The first rack gear and the second rack gear may be curved in a curve shape.

The gear module may further include a motor, and a controller controlling the motor to control the angle or arrangement of the first frame and the second frame.

The electronic device may further comprise a magnet arranged in the frames; a hall sensor generating a signal if the magnet is arranged at a predetermined distance; and a controller changing basic setup of the electronic device in accordance with the signal generated by the hall sensor.

The hall sensor may include a plurality of hall sensors arranged to be spaced apart from one another in a length direction of the frames, and the frame control unit may change the angle or arrangement of the frames to a plurality of stages.

The electronic device may further comprise a body recognition sensor arranged on a surface of the middle housing, generating a signal when a user wears the electronic device;

a controller arranged in the main body housing, activating a function of the electronic device if the body recognition sensor generates the signal; and a flexible substrate arranged in the frames, connecting the body recognition sensor with the controller.

The electronic device may further comprise a length controller inserting or detaching the frames to or from the main body housing.

The length controller may include a plurality of length control grooves formed at an inner side of the main body housing, and a length control protrusion formed at an outer side of the other side of the frames and inserted into one of the plurality of length control grooves, and the length control protrusion may move to its neighboring length control groove if a force is applied to the frames.

An electronic device comprises a middle housing; a pair of frames respectively coupled to both sides of the middle housing; a main body housing coupled to the frames, in which electronic components are packaged; and a frame control unit for controlling an angle or arrangement between the middle housing and the frames.

The frame control unit may include a hinge unit coupled to one end of at least one of the pair of frames and provided with a first sawtooth at an outside, the frames may include a second sawtooth engaged with the first sawtooth, and a position of the second sawtooth engaged with the first sawtooth may be changed when the frames are rotated based on the hinge unit.

The electronic device may further comprise frame holes formed at one side and the other side of the middle housing, into which one ends of the frames are inserted; a shutter cover covering the frames at both sides of a first direction of the frame holes; and a first elastic member applying a force for pushing the shutter cover to the frames.

The frame control unit may include a hinge unit rotatably coupling one end of at least one of the pair of frames to the middle housing; a wheel rotatably coupled to the middle housing; and a wire having one end fixed to the wheel and the other end coupled to one end of the frame at a position spaced apart from the hinge unit.

The electronic device may further comprise a second elastic member applying a pushing force opposite to a tensile force of the wire in contact with a wire coupling portion of the frame.

The frame control may further include a fixing hole formed in the wheel; a fixing groove formed in a position corresponding to the fixing hole in accordance with rotation of the wheel; and a fixing pin inserted into the fixing hole and the fixing groove.

The frame control unit may include a moving bracket arranged at the inner side of the middle housing, including a hinge rotatably coupled to one end of the frame; and a button having one end which is in contact with an upper side of the moving bracket and the other end arranged at the outer side of the middle housing, and if a force is applied to the other end of the button and thus the button moves to the inner side of the middle housing, the moving bracket moves to a lower side, and the hinge changes the angle between the frames while being rotated.

The electronic device may further comprise a guide slot formed at the inner side of the middle housing; and a guide protrusion protruded from the moving bracket, having an end inserted into the guide slot and moving along the guide slot when the moving bracket moves.

The moving bracket may include a first moving bracket which is in contact with the button; and a second moving bracket having one end coupled to both ends of the first moving bracket by a first hinge and the other end coupled to one end of the frame by a second hinge.

The electronic device may further comprise a guide slot formed at the inner side of the middle housing in a left and right direction; and a guide protrusion protruded from the second hinge, moving along the guide slot when the moving bracket moves.

The electronic device may further comprise a third elastic member arranged below the moving bracket, pushing the moving bracket to an upward direction.

The electronic device may further comprise a button housing arranged at the inner side of the middle housing, surrounding the circumference of the button; and a height control groove formed at an inner side of the button housing, including a plurality of stop grooves having different heights in an up and down direction and a plurality of inclined grooves formed between the plurality of stop grooves, wherein the button includes: a first button having one side arranged at the inner side of the middle housing and the other side exposed to the outer side of the middle housing; a second button fixed to an upper surface of the moving bracket, having an upper circumference of a sawtooth shape; a third button surrounding a circumference of one side of the first button, having a lower circumference corresponding to the sawtooth of the upper circumference of the second button; and a stop protrusion protruded to an outer side of the third button, moving from a first stop groove to a second stop groove through an inclined groove if a force is applied to the button.

The electronic device may further comprise a first magnet arranged at one end of the frame; and a plurality of second magnets having polarities opposite to that of the first magnet, wherein the plurality of second magnets may be arranged at the inner side of the middle housing in a left and right direction.

The second magnets may be formed in a recessed portion, and the first magnet may further include a protrusion corresponding to a shape of the recessed portion.

The plurality of second magnets may be arranged above the middle housing, and the second magnet at a center portion may be arranged below the second magnets of both sides.

The pair of frames may include a first frame and a second frame, the main body housing may include a first main body housing coupled to the first frame, a second main body housing coupled to the second frame, and may further include a cable or flexible substrate connected to the first main body housing, the first frame, the middle housing, the second frame and the second main body housing.

Advantageous Effects

An electronic device according to the present invention may include a frame control unit that may vary an angle of a band worn on a neck of a user, and may be provided detachably on a neck of a user with convenience and stably fixed to the neck of the user when the user wears the electronic device.

Also, if a frame at one side moves, a frame at the other side moves symmetrically, whereby a shape of the band is not distorted asymmetrically.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BEST MODE FOR CARRYING OUT THE INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In the following description, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

In this application, it is to be understood that the terms such as "include" and "has" are intended to designate that features, numbers, steps, operations, elements, parts, or their combination, which are disclosed in the specification, exist, and are intended not to previously exclude the presence or optional possibility of one or more other features, numbers, steps, operations, elements, parts, or their combinations.

Figure 1:
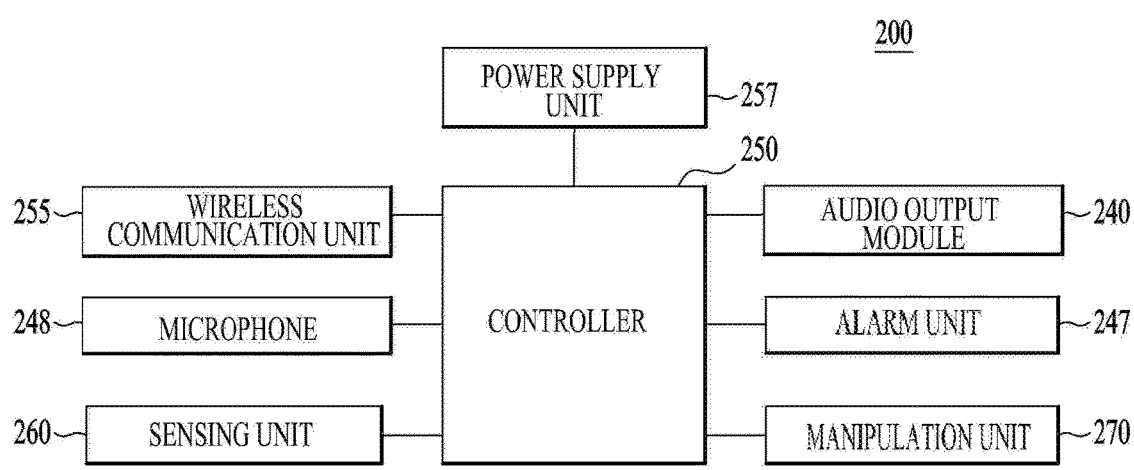
FIG. 1 is a block diagram illustrating a configuration of an electronic device according to the present specification.

FIG. 1 is a block diagram illustrating a configuration of an electronic device 200 according to the present specification. The electronic device 200 of the present invention includes a controller 250, a wireless communication unit 255, a receiver 240, a speaker 243, a microphone 248 and a power supply unit 257.

The wireless communication unit 255 is a device that receives an audio signal from an external terminal or an external server or delivers sound or signal input through the electronic device 200 to the external terminal or the external server in a wireless mode. A main example of the wireless communication unit 255 may include Bluetooth.

Bluetooth is a main short distance wireless technology standard that connects portable devices, such as a cellular phone, a notebook computer, an earphone, and a headphone, with each other to exchange information. Bluetooth is mainly used when low power wireless connection is required at a very short range of 10 meters to 20 meters, and uses 2400 MHz to 2483.5 MHz corresponding to ISM (Industrial Scientific and Medical) frequency bandwidth.

A total of 79 channels ranging from 2402 MHz to 2480 MHz except a range from 2 MHz after 2400 MHz to 3.5 MHz prior to 2483.5 MHz are used to avoid interference of the other systems that use up and down frequencies. ISM is a frequency bandwidth allocated for industrial, scientific and medical use, and does not need to grant a use for a radio wave and thus is mainly used for personal wireless devices that emit a radio wave of a lower power. Amateur wireless, wireless LAN and Bluetooth use this ISM bandwidth.

After initially connected with the external terminal, the electronic device 200 records corresponding connection information and if the electronic device 200 is power on and the external terminal previously connected to the electronic device 200 is arranged within a predetermined distance, the electronic device 200 is connected with the external terminal.

If another external terminal attempt to be connected with the electronic device 200 in a state that the electronic device 200 is connected with one external terminal, the electronic device 200 is disconnected from the previously connected external terminal and may be connected with another external terminal, and may be simultaneously connected (multi-connected) with two external terminals.

The audio output unit 240 is a device that outputs audio, and may include a receiver used to be installed to adjoin ears of a user, and a speaker delivering sound to the user in a state the speaker is held. A size of sound output from the receiver is smaller than that output from the speaker.

The microphone 248 processes an external audio signal to electrical audio data. The processed audio data is delivered to the external terminal or external server through the wireless communication unit 255. The microphone 248 may implement various noise removal algorithms for removing noise generated in the process of receiving an external audio signal.

The sensing unit 260 is a device for sensing a state of the electronic device 200 and a peripheral status, and may include an illumination sensor for sensing peripheral brightness, a touch sensor for sensing a touch input, a gyro sensor for sensing a slope and position of the electronic device 200, and a receiver switch 266 for sensing whether the receiver has been arranged in a receiver holder.

A manipulation unit 270 is an input unit for allowing a user to intentionally control the electronic device 200, and includes user input units 271 and 272 for call/power source/play or volume control and a button 337 for controlling an angle of a band 210.

Figure 2A:
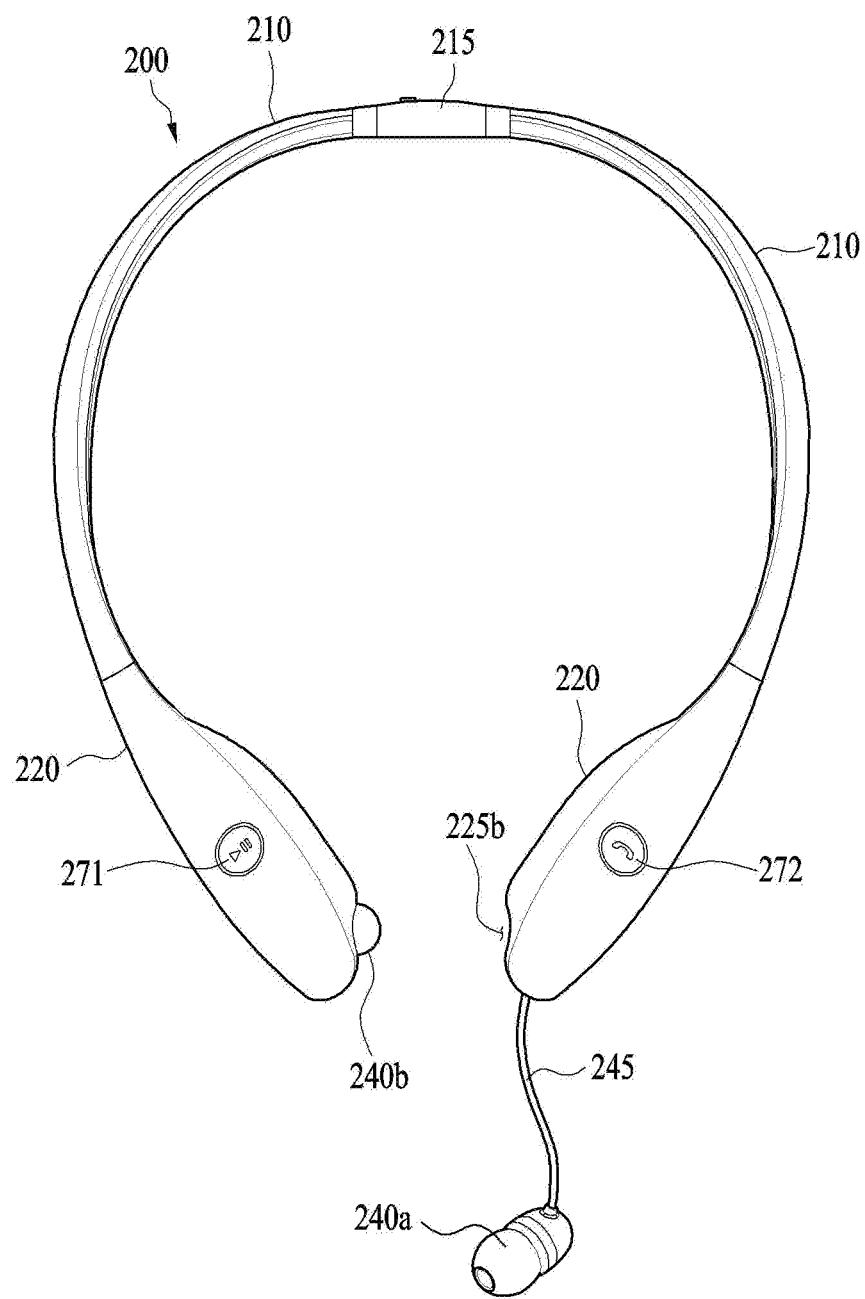
FIG. 2a is a plane view illustrating a first state of an electronic device according to the present invention.
Figure 2B:
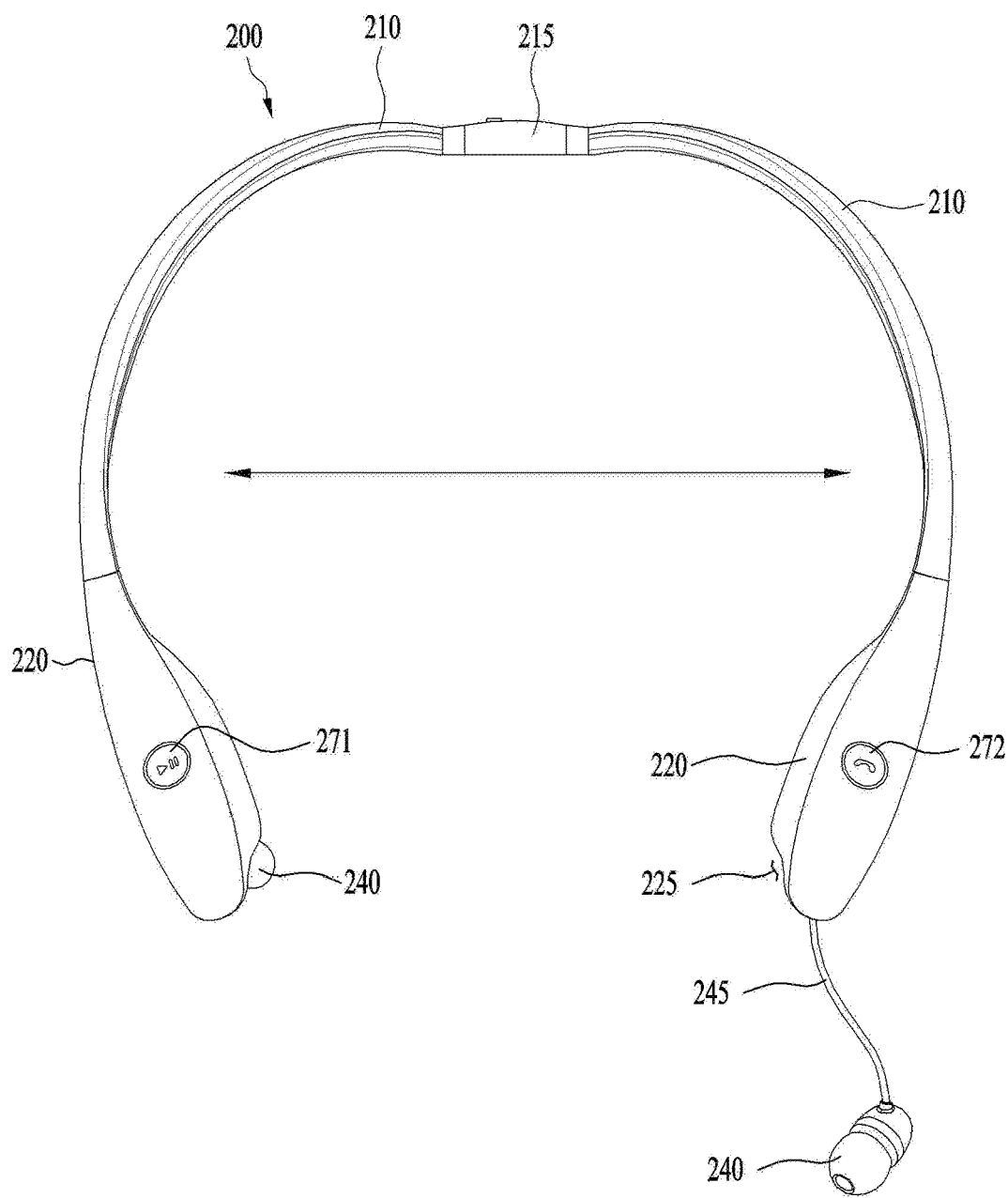
FIG. 2b is a plane view illustrating a second state of an electronic device according to the present invention.

FIGS. 2a and 2b are perspective views illustrating an electronic device 200 according to one embodiment of the present invention, which is viewed in one direction. The electronic device 200 of the present invention includes a band 210 comprised of a pair of frames 211 and 212, a main body housing 220, a middle housing 215, an audio cable 245, a receiver 240, a wireless communication unit 255, and a controller 250.

Figure 13:
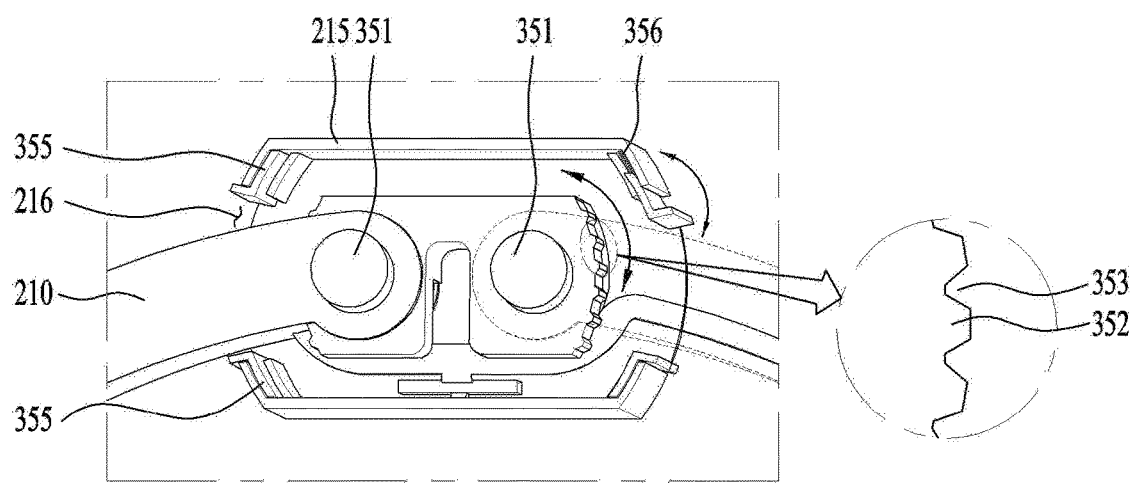
FIG. 13 is an exploded view illustrating a frame control unit of an electronic device according to the present invention.

The band 210 is a U shaped bent linear member, and may be worn on a neck of a user by insertion at the rear side. An angle between a pair of frames 211 and 212 may be increased as shown in FIG. 13 to allow the user to easily wear the band 210. The frame control unit 300 arranged to vary the angle between the frames 211 and 212 may be packaged in the middle housing 215.

The pair of frames 211 and 212 are coupled with the main body housing 220 having one end coupled to both sides of the middle housing 215 and the other end in which electronic components are packaged, as shown in FIGS. 2a and 2b. The pair of frames 211 and 212, the middle housing 215 and the main body housing 220 are arranged in a U shape or C shape.

A control portion in which the power supply unit 257 of a wire shape, the wireless communication unit 225, and a flexible substrate 252 for signal transfer are arranged may be provided at the inner side of the frames 211 and 212.

The housing 220 is arranged at both ends of the band 210, and the controller 250, the wireless communication unit 255, the microphone 248, the sensing unit 260, the manipulation unit 270, the power supply unit 257 and an alarm unit 247 are packaged in an inner space formed by coupling of an upper housing and a lower housing.

The power supply unit 257 is arranged in the housing 220 at one side, and the other components such as the microphone 248, the speaker 243 and the wireless communication unit 255 are arranged at the other side, whereby the components packaged in the housing 220 may be distributed evenly for balance of both sides.

The receiver holder 225 arranged at the end of the main body housing 220 is recessed in a shape corresponding to a shape of the receiver 240, and a magnet 226 arranged at the inner side of the receiver holder 225 attaches the receiver 240 to the receiver holder 225 if the receiver 240 is arranged to adjoin the receiver holder 225.

The receiver 240 outputs sound at a lower power in an earphone mode, and outputs sound at a high power in a speaker mode, whereby the receiver 240 may also be used as a speaker.

An indicator may display whether the wireless communication unit 255 is connected, to display that an event occurs or display charging, and may display a state of the wireless electronic device 200 by using a color and a flickering speed. The indicator may be arranged at a side of the main body housing 220, and may be formed in the periphery of a First user input unit 271.

The electronic device 200 may use a vibration mode to notify the user of an event. A vibrator may be provided inside the main body housing 220, whereby the vibrator 247 as well as the indicator may be operated to notify the user of occurrence of a new event.

A charging terminal for charging may be arranged in the main body housing 220, and a cap may be provided to prevent the charging terminal from being exposed externally.

A first button 272 for play power ON/OFF and a second user input unit 272 for call may be provided on a surface of the main body housing 220.

A jog button for turning, a slide button for inputting a signal by pushing, or a dome switch button having a dome switch may be used as the user input units 271 and 272. At this time, an opening for the user input units 271 and 272 may be formed in the main body housing 220.

Also, the user input units 271 and 272 may input a signal by means of a touch of a user through a touch sensor.

Both ends (an interval between main body housings) of a curve of the electronic device 200 is preferably narrower than a neck size of a user so that a curve formed by the pair of frames 211 and 212, the middle housing 215 and the main body housing 220 may not be detached from the neck of the user. However, if both ends of the electronic device 200 are narrower than the neck size of the user, it is difficult for the user to wear the electronic device 200, and since the neck size is different depending on users, it is required to control a width of the pair of frames of the electronic device 200.

A portion of the band 210 may be opened using an elastic member by a force of a user. However, in this case, a problem occurs in that the band portion is detached from the neck of the user and lost or is broken down and then damaged in case of big movement such as a case that the user takes exercise or drives a motorcycle.

Therefore, the electronic device 200 of the present invention may be used by all of users having various neck sizes, and when the electronic device is detached from the neck of the user, the user may vary the angle between the pair of frames 211 and 212 by easily opening both ends of the electronic device 200 and control the band 210 in a suitable shape for use by controlling the length of the frames 211 and 212.

FIG. 2a illustrates a first state that the angle between the frames is narrow, and FIG. 2b illustrates a second state that the angle between the frames is opened. The electronic device 200 of the present invention may vary the angle between the pair of frames 211 and 212 or the length of the pair of frames 211 and 212 at the first state and the second state through the frame control unit 300 arranged in the middle housing 215.

Hereinafter, each embodiment of the frame control unit 300 will be described with reference to the accompanying drawings.

The frame control unit 300 for controlling the angle between the frames 211 and 212 or the length of the frames 211 and 212 is arranged in the middle housing 215 coupled to one end of the frames 211 and 212.

Figure 3:
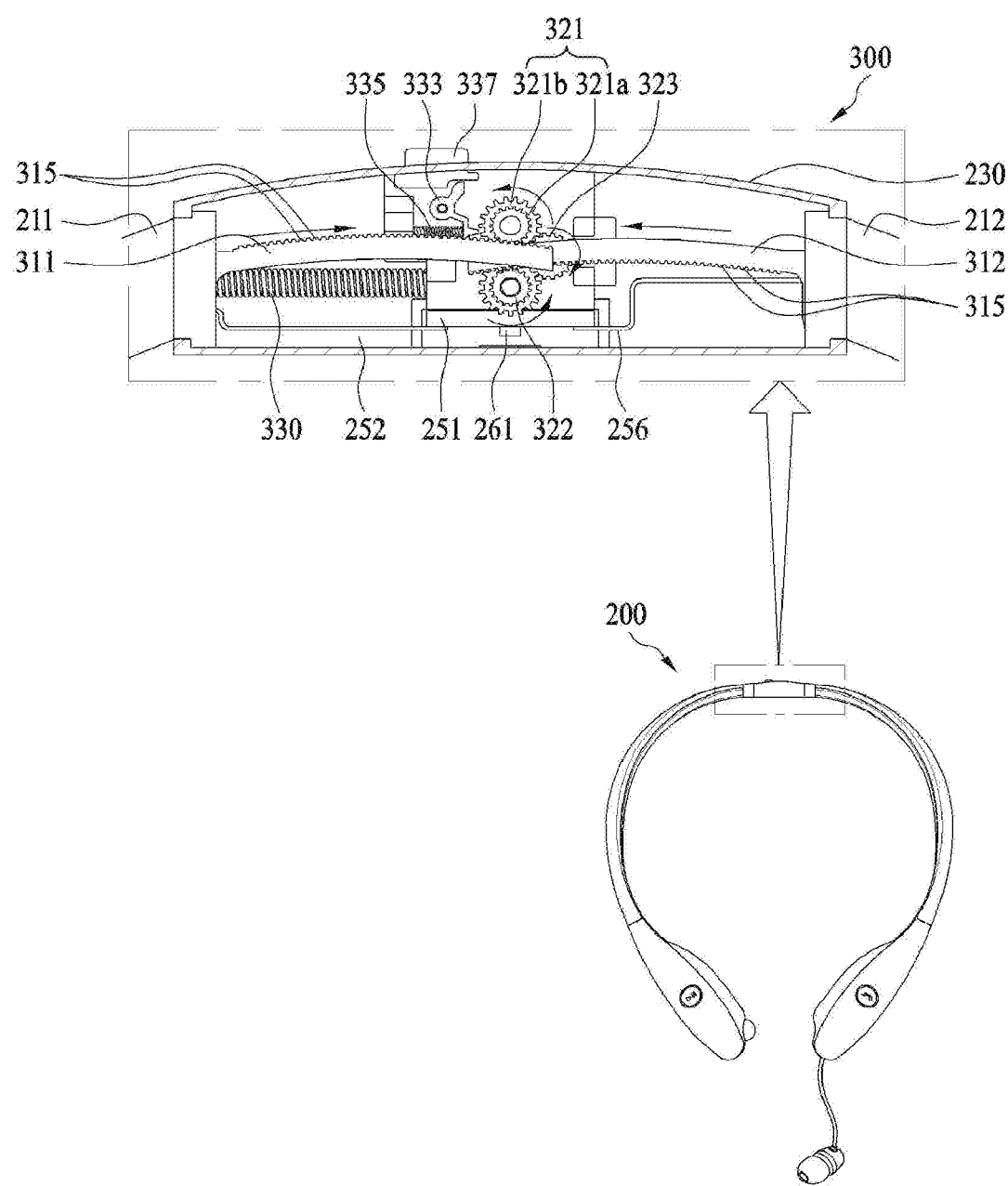
FIGS. 3 and 4 are cross-sectional views illustrating a frame control unit arranged in a middle housing of an electronic device according to the present invention.
Figure 4:
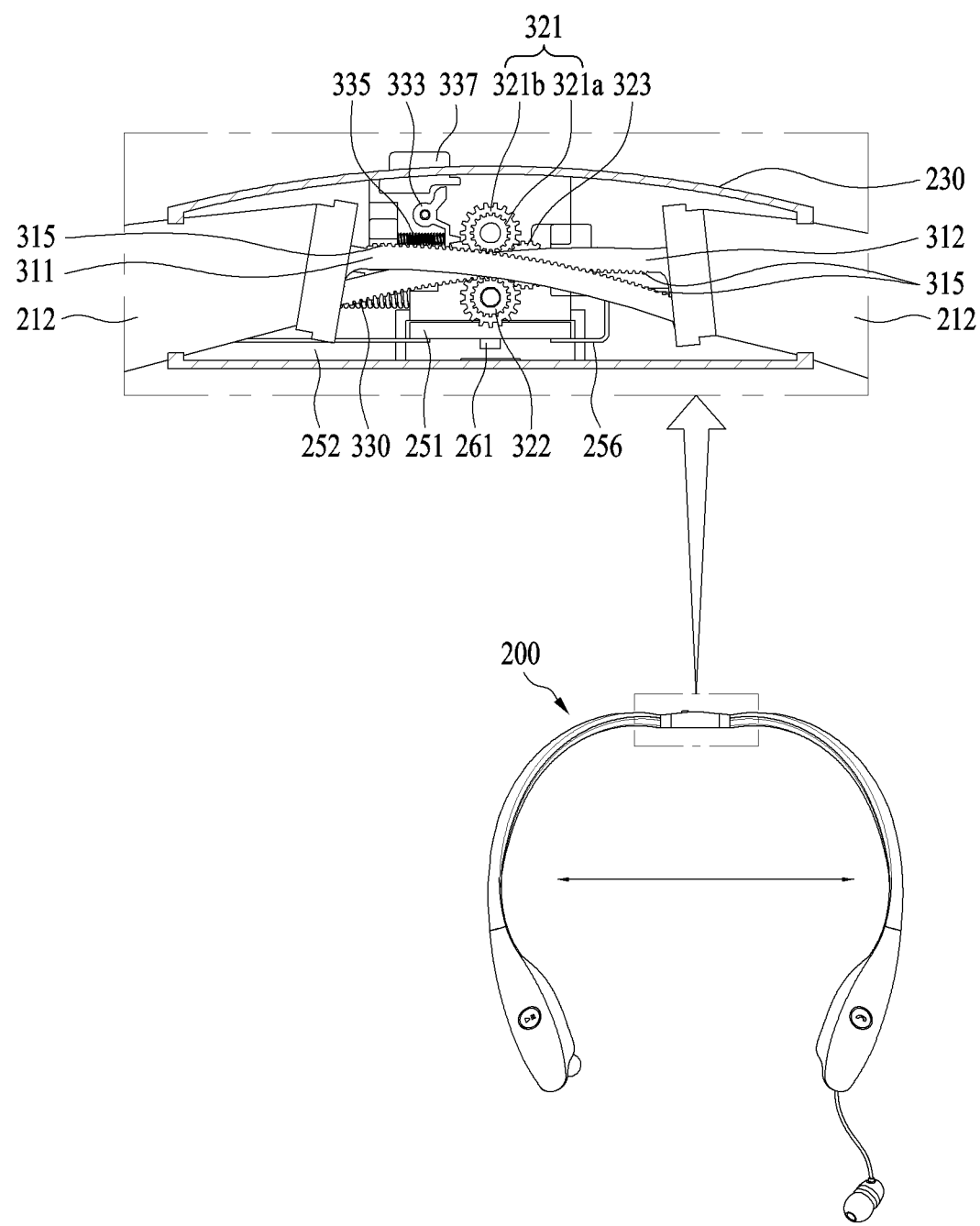

FIGS. 3 and 4 are cross-sectional views illustrating a frame control unit 300 arranged in a middle housing 215 of an electronic device 200 according to the present invention. The frame control unit 300 of this embodiment includes a gear module that includes a pair of rack gears 311 and 312 and a plurality of gears 321, 322 and 323 having sawteeth engaged with sawteeth 315 of the rack gears 311 and 312.

The rack gears 311 and 312 are provided with the sawteeth 315 formed along a length direction at one side of a bar shaped member, and serves to switch a rotary motion to a linear motion or vice versa by being engaged with a disk shaped gear (pinion gear) rotated to be engaged with the sawteeth 315. The present invention is characterized in that the disk shaped gears included in the gear module are rotated by linear motion of the pair of rack gears 311 and 312 or deliver a force on the contrary to the rotary motion.

The first rack gear 311 is extended from one end of the first frame 211 and the second rack gear 312 is extended from one end of the second frame 212, wherein the first rack gear 311 is extended in an opposite direction of the second rack gear 312. The sawteeth 315 of the first rack gear 311 and the second rack gear 312 may be arranged in their opposite directions (the sawteeth of the first rack gear 311 is arranged at an upper side, whereas the sawteeth of the second rack gear 312 is arranged at a lower side), and their directions may be varied depending on arrangement with the respective gears 321, 322 and 323 of the gear module.

The gear module of this embodiment may include a first pinion gear 321, a second pinion gear 322, and a spur gear 323. The first pinion gear 321 and the spur gear 323 are rotated to be engaged with each other, and the spur gear 323 and the second pinion gear 322 are rotated to be engaged with each other. If one of the three gears 321, 322 and 323 is rotated, the other gears are rotated at the same time, and the rotational directions of the first pinion gear 321 and the second pinion gear 322 are equal to each other, and the spur gear 323 is rotated in a direction opposite to the rotational directions of the first and second pinion gears.

The first pinion gear 321, the second pinion gear 322 and the spur gear 323 are sawteeth shaped spur gears provided with sawteeth formed at the outside, and are rotated using the center of a sawteeth wheel as a shaft. The first pinion gear 321 and the first rack gear 311 are rotated to be engaged with each other, and the second pinion gear 322 and the second rack gear 312 are rotated to be engaged with each other. That is, a linear motion of the rack gears 311 and 312 is switched to a rotary motion of the pinion gears 321 and 322.

A moving direction of the rack gears 311 and 312 and a rotational direction of the pinion gears 321 and 322 are determined depending on the position where the sawteeh of the rack gears 311 and 312 are formed and the position where the pinion gears 321 and 322 are engaged with each other. In this embodiment, since the first rack gear 311 is arranged below the first pinion gear 321, the first pinion gear 321 is rotated counterclockwise when the first rack gear 311 moves to a right side. Since the second rack gear 312 is arranged above the second pinion gear 322, the second pinion gear 322 is rotated counterclockwise when the second rack gear 312 moves to a left side.

The first pinion gear 321 and the second pinion gear 322 are arranged up and down as shown in FIG. 3, and the first rack gear 311 and the second rack gear 312 are arranged between the first pinion gear 321 and the second pinion gear 322. Since the first rack gear 311 is arranged below the first pinion gear 321 and the second rack gear 312 is arranged above the second pinion gear 322, the sawteeth engaged with the first pinion gear 321 are formed above the first rack gear 311, and the sawteeh engaged with the spur gear 323 are formed below the second rack gear 312.

Although the first rack gear 311 and the second rack gear 312 may be formed in a linear shape, the first rack gear 311 and the second rack gear 312 may be curved in a curve shape as shown in FIG. 3. If the first rack gear 311 and the second rack gear 312 are curved in a curve shape, since the gear module is fixed, if the pair of rack gears 311 and 312 move along rotation of the gear module, the angle between the pair of frames 211 and 212 is varied.

If the user opens the angle between the pair of frames 211 and 212, the first rack gear 311 moves to a right side, and the second rack gear moves to a left side, whereby the first pinion gear 321 and the second pinion gear 322 are rotated and the spur gear 323 between the first pinion gear 321 and the second pinion gear 322 is also rotated in an opposite direction of the first pinion gear 321 and the second pinion gear 322. Since the three gears are engaged with one another, even though only one gear is rotated, the other gears are rotated together, whereby the first frame 211 and the second frame 212 move symmetrically.

If the angle between the first frame 211 and the second frame 212 is opened to the maximum range, the state shown in FIG. 4 is provided, and the first rack gear 311 and the second rack gear 312 cross each other in an X shape based on the center between the first pinion gear 321 and the second pinion gear 322. If the first rack gear 311 and the second rack gear 312 cross each other in an X shape, the pair of frames 211 and 212 are opened as shown in FIG. 4, and the user may easily detach or attach the electronic device 200 from or to his/her body.

Figure 5:
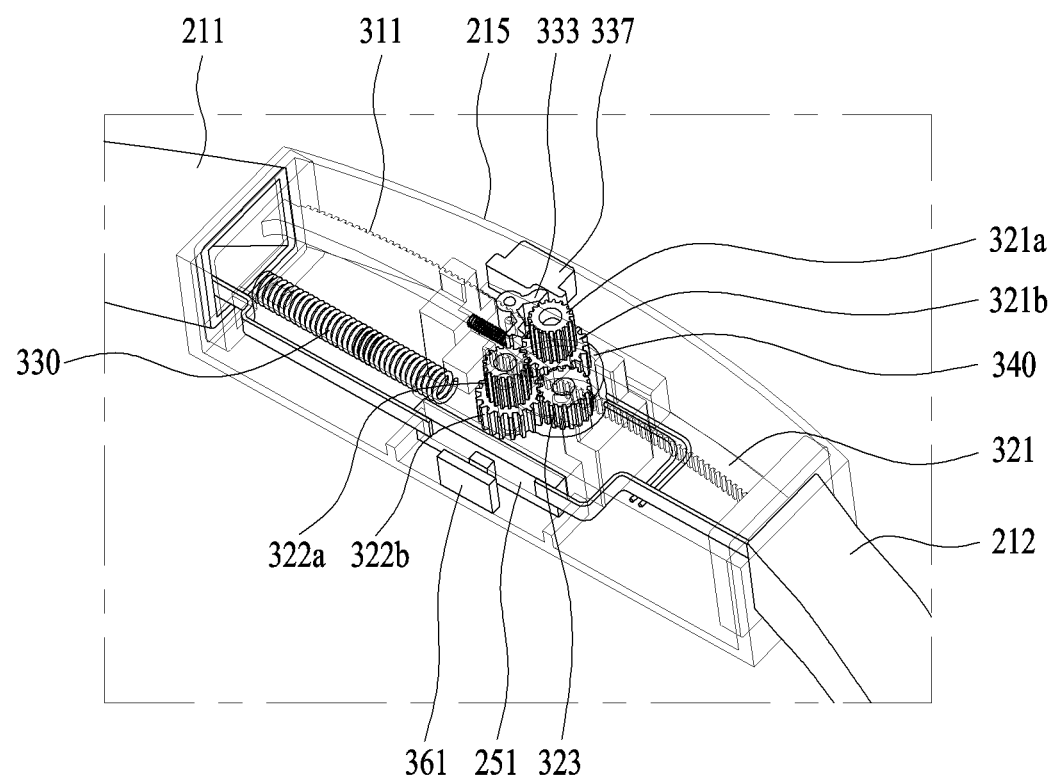
FIG. 5 is a perspective view illustrating a frame control unit packaged in a middle housing of an electronic device according to the present invention.

FIG. 5 is a perspective view illustrating a frame control unit 300 packaged in a middle housing 215 of an electronic device 200 according to the present invention. The pinion gears 321 and 322 are rotated to be engaged with the rack gears 311 and 312 and at the same time rotated to be engaged with the spur gear 323. The portions of the pinion gears 321 and 322 engaged with the rack gears 311 and 312 and engaged with the spur gear 323 may be arranged on different portions on outer circumference surfaces of the pinion gears 321 and 322 but may be spaced apart from each other in a shaft direction of the pinion gears 321 and 322 to be arranged on different planes as shown in FIG. 5.

The pinion gears 321 and 322 of the present invention may be two gears rotated based on the same shaft, having their respective diameters different from each other. There are a power transmission gear 321a, and drive gears 321b and 322b rotated based on the same shaft as that of the power transmission gear 321a, having a diameter smaller than that of the power transmission gear 321a. The drive gears 321b and 322b are rotated to be engaged with the rack gears 311 and 312, and are arranged on a plane different from that of the power transmission gears 321a and 322a, whereby a moving path of the rack gears 311 and 312 is not disturbed by the spur gear 213.

The pinion gears 321 and 322 may be formed to have a wide width in a shaft direction to arrange the rack gears 311 and 312 and the spur gear 323 on different planes. However, a step difference may be given to prevent the rack gears 311 and 312 from moving in a shaft direction and then moving to the same plane as that of the spur gear 323. In addition to the spur gear and the rack gears 311 and 312, the pair of rack gears 311 and 312 of this embodiment may be arranged on different planes to cross in an X shape as shown in FIG. 4. Although the drive gear 321b of the first pinion gear 321 and the drive gear 322b of the second pinion gear 322 are arranged in the same direction, the drive gears 321b and 322b may be arranged on their opposite surfaces based on the power transmission gears 321a and 322a.

A motor 240 for rotating one of the pinion gears 321 and 322 or the spur gear 232 may further be provided, and the angle between the first frame 211 and the second frame 212 may be controlled automatically using the motor 240.

Figure 6:
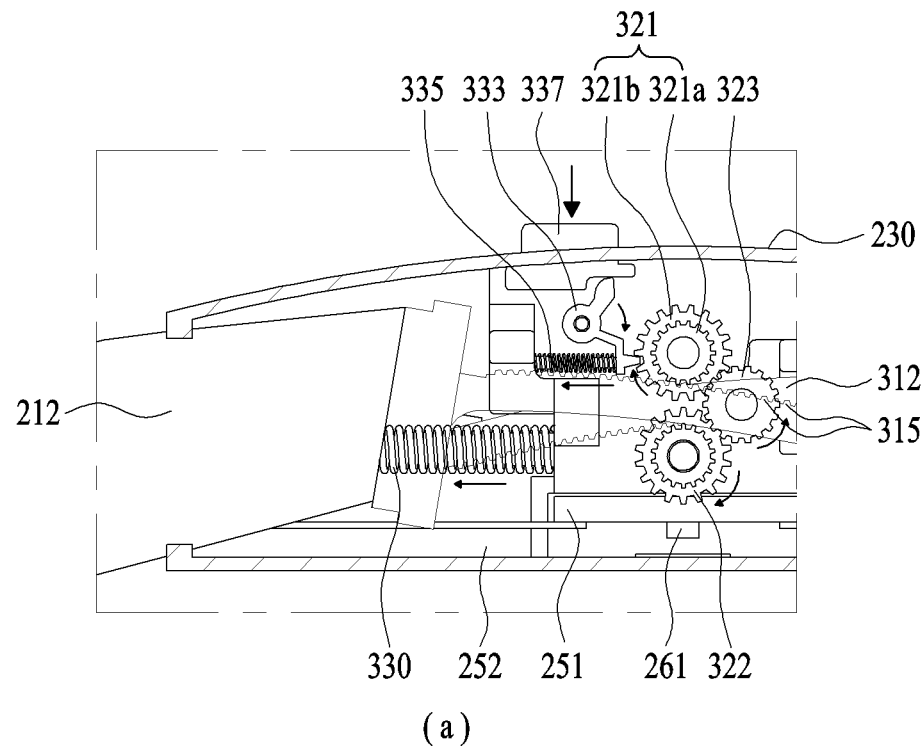
FIG. 6 is a view illustrating elements arranged behind rack gears of FIGS. 3 and 4.
Figure 6:
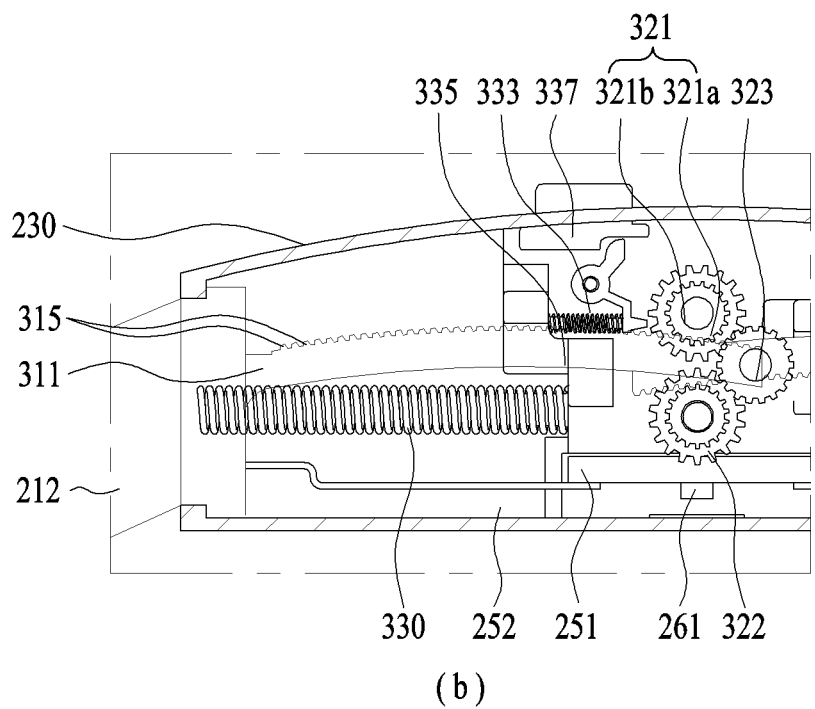

FIG. 6 is a view illustrating elements arranged behind rack gears 311 and 312 of FIGS. 3 and 4. The frame control unit 300 of this embodiment includes a first elastic member 330 for applying a force to a direction of the first frame 211 detached from the middle housing 215, and a stopper 333 for restricting rotation of the gears.

One side of the first elastic member 330 may be coupled to the middle housing 215, and the other side of the first elastic member 330 may be coupled to the first frame 211. The first elastic member 330 may be provided at both sides of the first frame 211 and the second frame 212. The first elastic member 330 serves to form the angle between the first frame 211 and the second frame 212 as a basic state by pushing the first frame 211, as shown in FIG. 3.

That is, if the user opens the portion between the first frame 211 and the second frame 212 to wear the electronic device on his/her neck, the state of FIG. 4 is formed, and if the force is removed, the state of FIG. 3 is restored by the first elastic member 330, whereby the electronic device may be worn to be wound on the neck of the user to prevent loss or damage caused by drop from occurring.

However, since a user who has a thick neck size may feel inconvenience in wearing if the angle between the first frame 211 and the second frame 212 is too small, the stopper 333 for restricting rotation of the gear module may further be provided. The stopper 333 is hung in the sawteeth of any one of the first pinion gear 321, the second pinion gear 322 and the spur gear 323, and is not hung in the gear module if the angle between the first frame 211 and the second frame 212 is increased. However, if the gear module is driven in such a way that the angle between the first frame 211 and the second frame 212 is reduced, the stopper is engaged with the sawteeth of the gear module to restrict rotation of the gear module.

The stopper 333 is rotatably fixed to the middle housing 215, and has one side engaged with the sawteeth of the first pinion gear 321, wherein one side of the stopper 333 moves in accordance with a high and low level of the sawteeth of the first pinion gear 321 when the first pinion gear 321 is rotated. The frame control unit may further include a second elastic member 335 for applying a force to the first pinion gear 321 at one side of the stopper 333 to fix the sawteeth as the stopper 333 is inserted to a recessed portion between the sawteeth.

There may be provided a structure in which one directional rotation of the first pinion gear is permitted and the other directional rotation is restricted in accordance with a shape and arrangement of the other end portion of the stopper 333. In this embodiment, rotation of the stopper is permitted when the first pinion gear 321 is rotated counterclockwise and restricted when the first pinion gear 321 is rotated clockwise, whereby the frames 211 and 212 may be fixed in a state that the angle between the frames 211 and 212 is increased if the user increases the angle between the frames 211 and 212.

To reduce the angle between the first frame 211 and the second frame 212 in a state that the first frame 211 and the second frame 212 are opened, the other end of the stopper 333 is detached from the sawteeth of the first pinion gear 321. If the user pushes a button protruded outside the middle housing 215, a force is delivered to a pressurizing portion protruded from the stopper 333, whereby the stopper 333 is rotated and then detached from the sawteeth of the first pinion gear 321 as shown in FIG. 6(a).

As the force for restricting rotation of the first pinion gear 321 is removed, the first frame 211 is pushed to the outside of the middle housing 215 by elasticity of the first elastic member 330, whereby the first pinion gear 321 is rotated counterclockwise and thus the spur gear 323 and the second pinion gear 322 are rotated. Then, the second rack gear 312 moves to the right side and pushes the second frame 212 to the outside of the middle housing 215, whereby a state of FIG. 6(b) is formed. Therefore, the angle between the first frame 211 and the second frame 212 becomes narrow.

The electronic device 200 of this embodiment has a semi-automatic structure in which the angle between the frames 211 and 212 is increased if the user holds and opens the frames 211 and 212 and the angle between the frames 211 and 212 is reduced if the user pushes a button. Meanwhile, if the first elastic member 330 or the second elastic member 335 is not used and motion of the stopper 333 is restrictive, the user may control the angle between the frames 211 and 212 by applying a force of a predetermined size or more.

Figure 7:
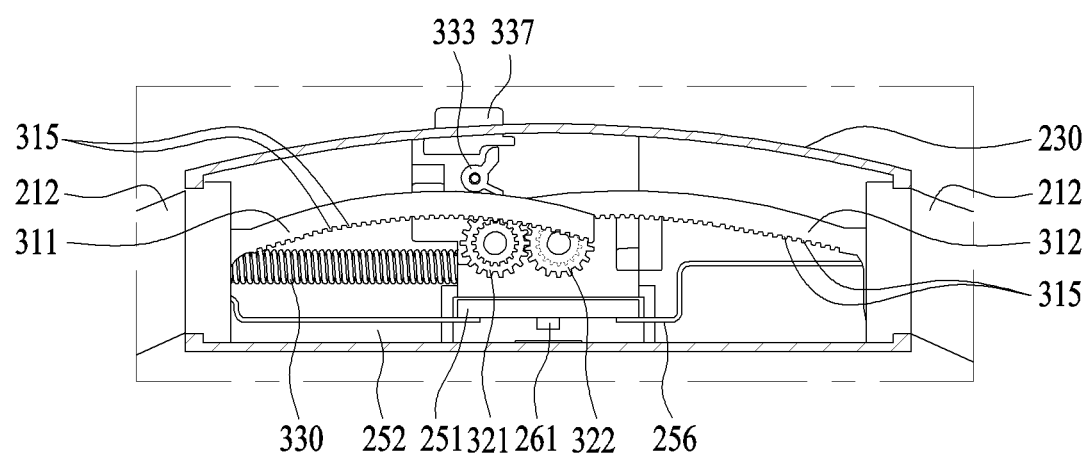
FIG. 7 is a cross-sectional view illustrating a frame control unit arranged in a middle housing of an electronic device according to the present invention.
Figure 7:
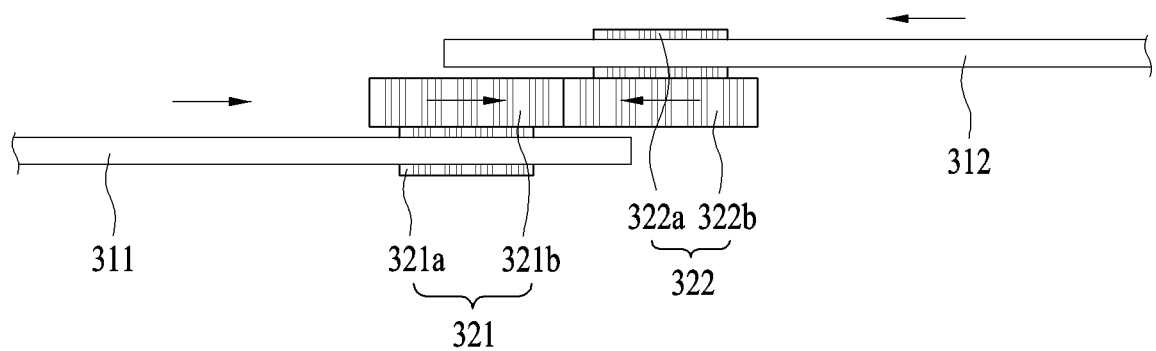

FIG. 7 is a cross-sectional view illustrating a frame control unit 300 packaged in a middle housing 215 of an electronic device 200 according to the present invention. In this embodiment, the first pinion gear 321 and the second pinion gear 322 are arranged in parallel and engaged with each other without the spur gear 323. The first rack gear 311 is engaged with the first pinion gear 321 and the second rack gear 312 is engaged with the second pinion gear 322.

Since the spur gear 323 exists between the first pinion gear 321 and the second pinion gear 322, the first pinion gear 321 and the second pinion gear 322 are rotated in the same direction. Therefore, the first rack gear 311 is provided with sawteeth thereon and arranged below the first pinion gear 321, and the second rack gear 312 is provided with sawteeth therebelow and arranged above the second pinion gear 322.

However, since there is no spur gear 323 in this embodiment, the first pinion gear 321 and the second pinion gear 322 are rotated in opposite directions. Therefore, the first rack gear 311 and the second rack gear 312 may be provided with the sawteeth in the same direction. Referring to FIG. 7, the sawteeth are formed below the first rack gear 311 and the second rack gear 312, and are arranged above the first pinion gear 321 and the second pinion gear 322.

The first pinion gear 321 and the second pinion gear 322 include drive gears 321b and 322b and power transmission gears 321a and 322a such that the first rack gear 311 and the second rack gear 312 may be arranged on different planes as shown in FIG. 7(b) to prevent the first rack gear 311 and the second rack gear 312 from collide with each other.

The drive gears 321b and 322b are engaged with the rack gears 311 and 312, and the power transmission gears 321a and 322a are engaged between the pinion gears 321 and 322. The drive gears 321b and 322b are arranged to be different from the first pinion gear 321 and the second pinion gear 322 based on the power transmission gears 321a and 322a to prevent from colliding with the first pinion gear 321 and the second pinion gear 322.

Even in the case that the drive gears 321b and 322b of the first pinion gear 321 and the second pinion gear 322 are arranged in the same direction in the same manner as the embodiment of FIG. 5, the first rack gear 311 and the second rack gear 312 are engaged with the drive gears 321b and 322b at different positions, whereby the drive gears 321b and 322b may move on different planes.

Figure 8:
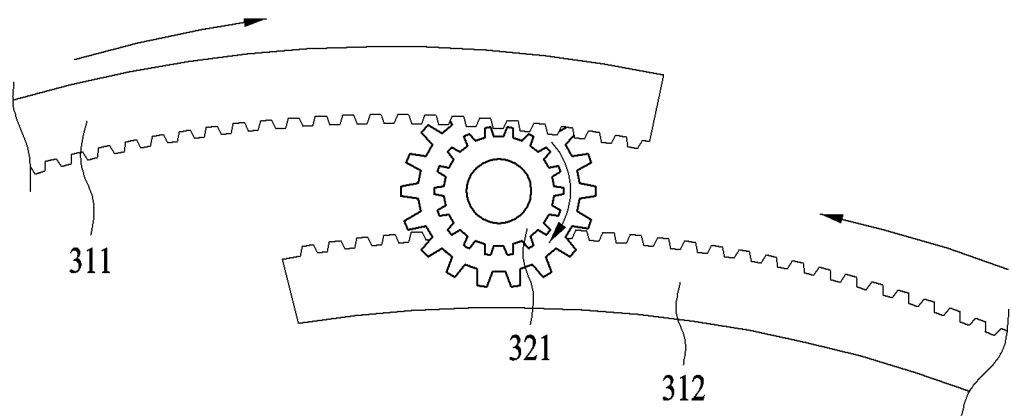
FIG. 8 is a cross-sectional view illustrating a frame control unit arranged in a middle housing of an electronic device according to the present invention.
Figure 8:
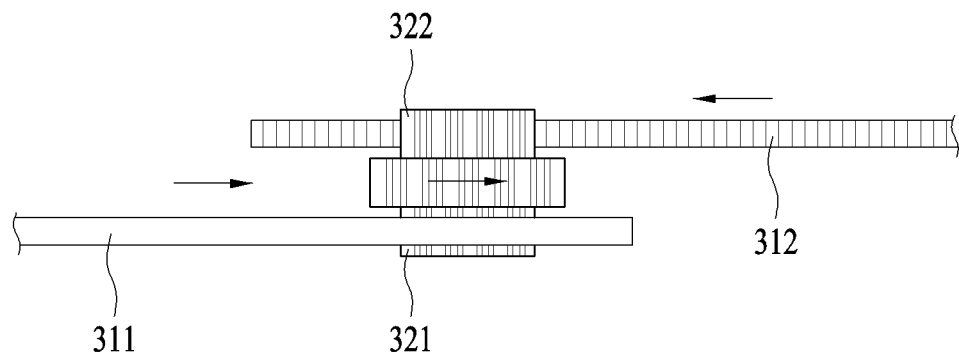

FIG. 8 is a cross-sectional view illustrating a frame control unit 300 packaged in a middle housing 215 of an electronic device 200 according to the present invention. In this embodiment, the first pinion gear 321 and the second pinion gear 322 are rotated based on the same shaft. Since the first pinion gear 321 and the second pinion gear 22 are rotated in the same direction like the embodiment of FIG. 3, the first rack gear 311 and the second rack gear 312 are coupled to the pinion gears 321 and 322 at different positions. The first rack gear 311 may be arranged to be engaged with the upper side of the first pinion gear 321 and the second rack gear 312 may be arranged to be engaged with the lower side of the second pinion gear 322 (the positions of the first rack gear 311 and the second rack gear 312 and the direction of the sawteeth which are formed may be changed reversely).

Figure 9:
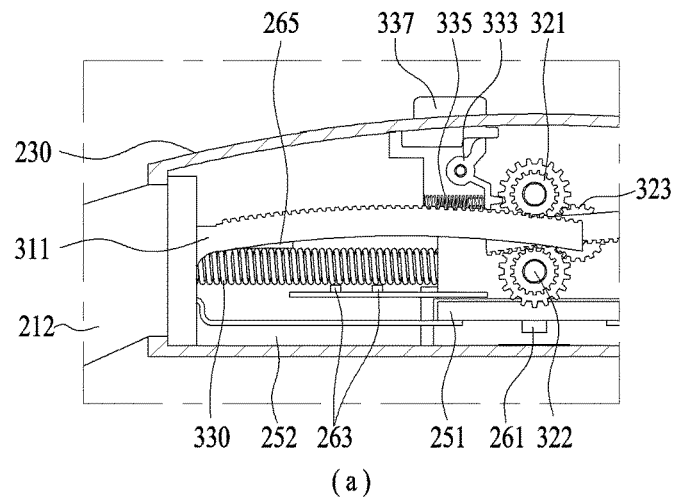
FIGS. 9 and 10 are views illustrating a magnet and a hall sensor for sensing frame movement of an electronic device according to the present invention.
Figure 9:
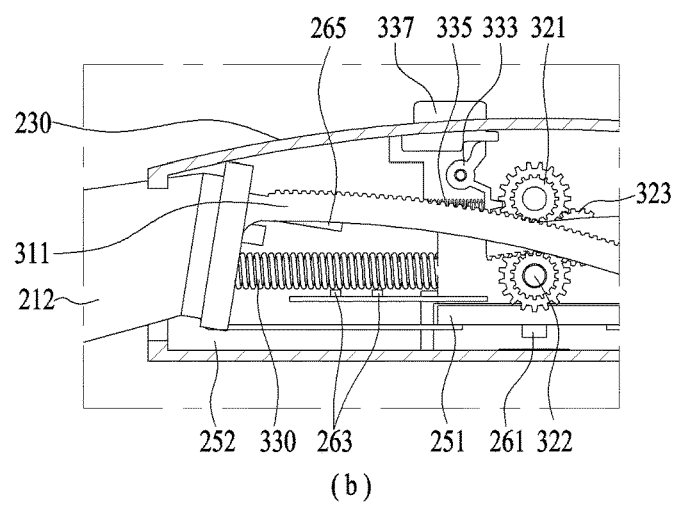
Figure 9:
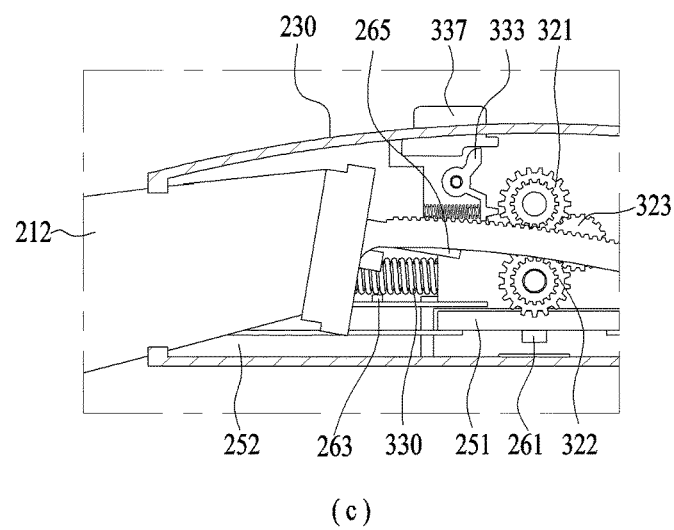

FIG. 9 is a view illustrating a magnet 265 and a hall sensor 263 for sensing movement of frames 211 and 212 of an electronic device 200 according to the present invention. At least one of the first rack gear 311 and the second rack gear 312 is provided with the magnet 265, and the hall sensor 263 is fixed to the middle housing 215, or vice versa. The hall sensor 263 senses a magnetic field varied depending on movement of the rack gears 311 and 312. If a plurality of hall sensors 263 are provided as shown in FIG. 9, the hall sensors may sense a position change of the frames 211 and 212 more accurately.

If the rack gears 311 and 312 move in accordance with rotation of the pinion gears 321 and 322, the angle of the frames 211 and 212 is varied as described above. As the angle between the first frame 211 and the second frame 212 is varied, magnetic change sensed by the hall sensor 263 may correspond to angle change as well as length change of the electronic device 200.

If two hall sensors 263 arranged in parallel along an extension direction of the first rack gear 311 and the magnet 265 provided in the first rack gear 311 are provided, a magnetic size sensed by the hall sensors 263 in arrangement shown in FIG. 9(a) is stronger than that in arrangement shown in FIG. 9(b). In case of arrangement shown in FIG. 9(c), a strong magnetic change may be sensed by the two hall sensors 263. That is, the angle between the first frame 211 and the second frame 212 may be calculated based on the magnetic change sensed by each hall sensor 263.

Figure 10:
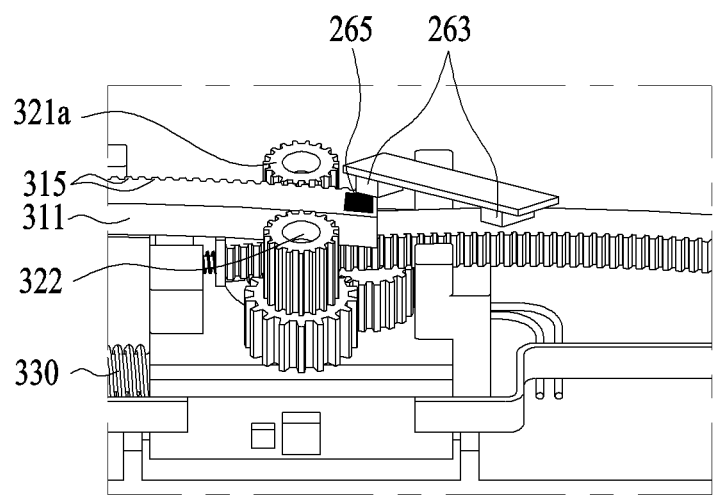
Figure 10:
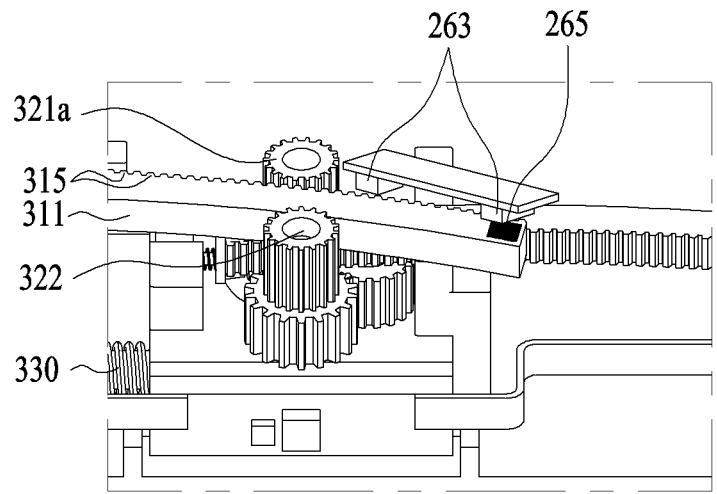

Alternatively, the hall sensor 263 may be arranged in a lateral direction of the rack gears 311 and 312 as shown in FIG. 10. In this case, the rack gears 311 and 312 are made by a curve, and a plurality of hall sensors 263 may be arranged to be inclined along the curve.

The angle change between the frames 211 and 212 may be calculated by a switch as well as the hall sensor 263 and the magnet 265, wherein the switch is pushed to allow ON/OFF to be switched by being pushed in accordance with the position change of the frames 211 and 212 or a photo sensor such as a proximity illumination sensor.

Figure 11:
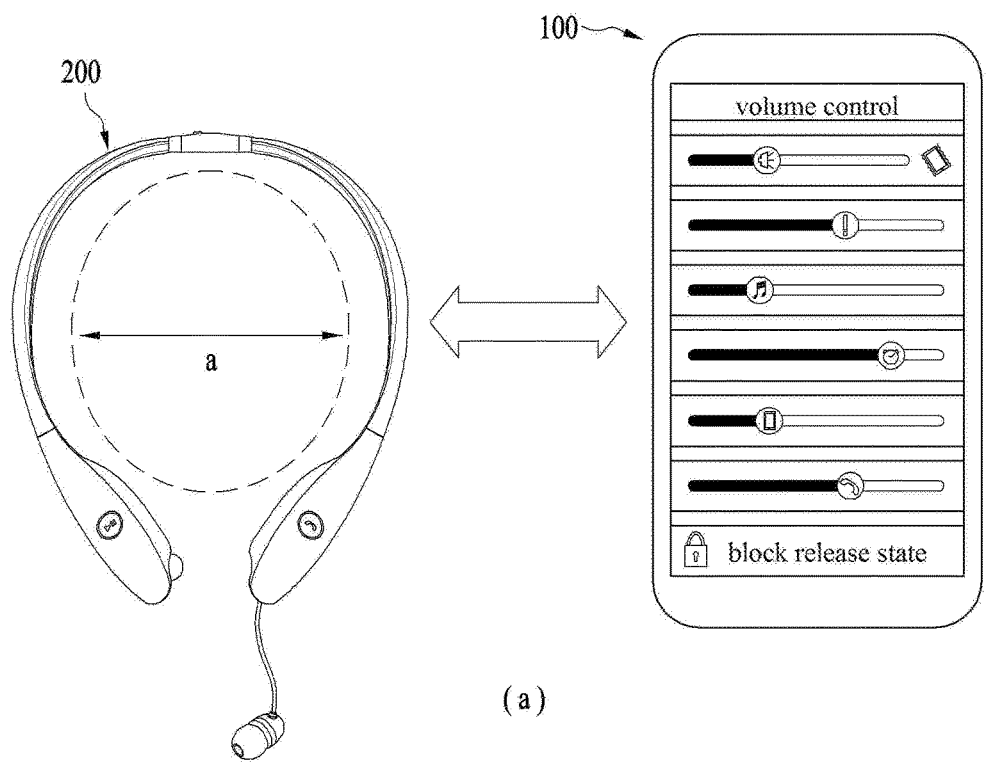
FIG. 11 is a view illustrating a setup method according to an angle between frames of an electronic device according to the present invention.
Figure 11:
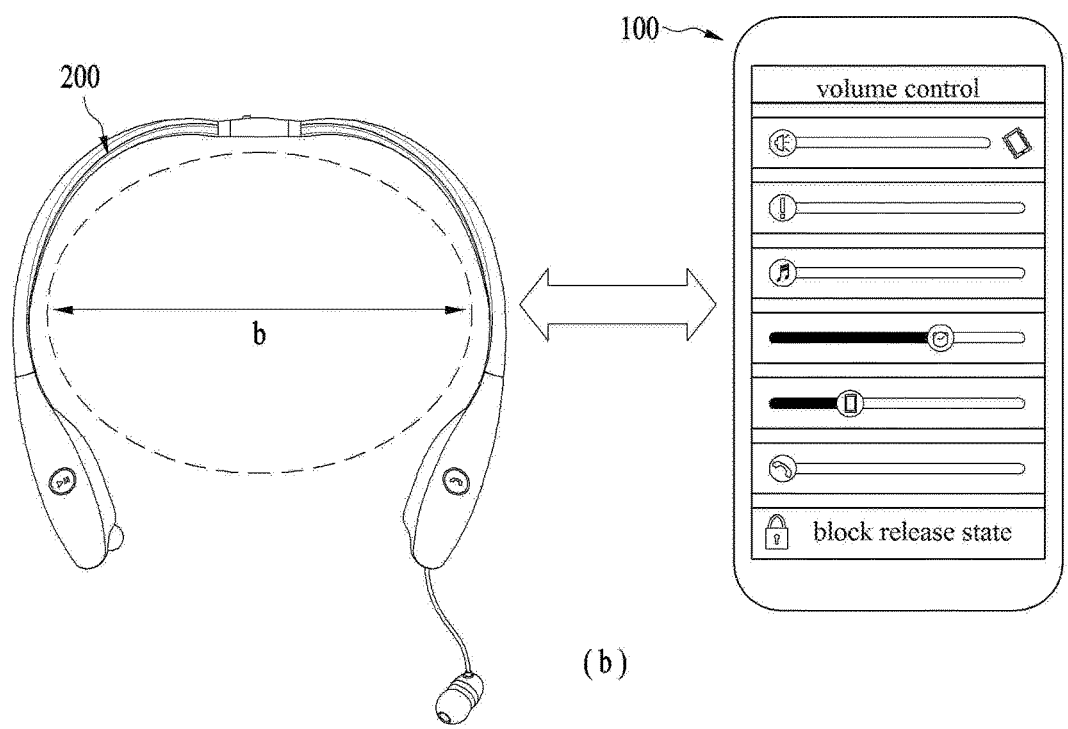

FIG. 11 is a view illustrating a setup method according to an angle between frames 211 and 212 of an electronic device 200 according to the present invention. As shown in FIGS. 9 and 10, the angle change between the frames 211 and 212 may be sensed using the hall sensors 263 and the magnet 265, and the angle change between the frames 211 and 212 may occur when the user wears the electronic device 200. However, if the angle between the frames 211 and 212 is fixed to a specific angle, it may be determined that another user wear the electronic device 200.

The angle between the frames 211 and 212 is changed while the user is wearing the electronic device 200. However, since the angle between the frames 211 and 212 is maintained at a predetermined angle in a state that the user has already worn the electronic device 200, it may be determined that the user wears the electronic device if the angle is maintained at a certain time or more.

A heartbeat sensor formed at an inner side (portion which touches a body of a user when the user wears the electronic device) of the middle frames 211 and 212, a proximity sensor, or a body recognition sensor 323 for sensing a wearing state of the user like a switch pushed when the user wears the electronic device may further be provided. The body recognition sensor 323 should be connected with the power supply unit 257 packaged in a module substrate 251, for supplying a power to generate an electrical signal, and needs to be connected with the controller 250 to deliver the signal to the controller 250. Therefore, the flexible substrate 252 may be used to connect the body recognition sensor 323 with the controller 250 provided in the main body housing 220 and a battery. The flexible substrate 252 is extended from the above sensor of the middle housing 215 along the frames 211 and 212 and connected with the controller 250 of the main body housing 220.

Since it may be determined whether the user has worn the electronic device, through the proximity sensor or heartbeat sensor provided in the middle frames 211 and 212, the angle between the frames 211 and 212 when the user has worn the electronic device may be sensed using the hall sensors 263 to identify the user.

As shown in FIG. 11(a), the controller 250 determines that a first user having a small neck size (a) has worn the electronic device if the angle between the frames 211 and 212 is narrow, and also determines that a second user having a great neck size (b) has worn the electronic device if the angle between the frames 211 and 212 is wide.

Setup of the electronic device 200 or setup of a synchronized terminal may be changed to another mode in accordance with the user's taste and usage aspect. In respect of setup of the electronic device 200, a basic sound volume may be controlled differently or a graphic equalizer of sound which is output may be set differently depending on users. Alternatively, the electronic device 200 may be synchronized with a different terminal. Setup of the synchronized terminal, such as screen arrangement of a home screen, volume control and favorite contact address, may be set differently depending on users.

Figure 12:
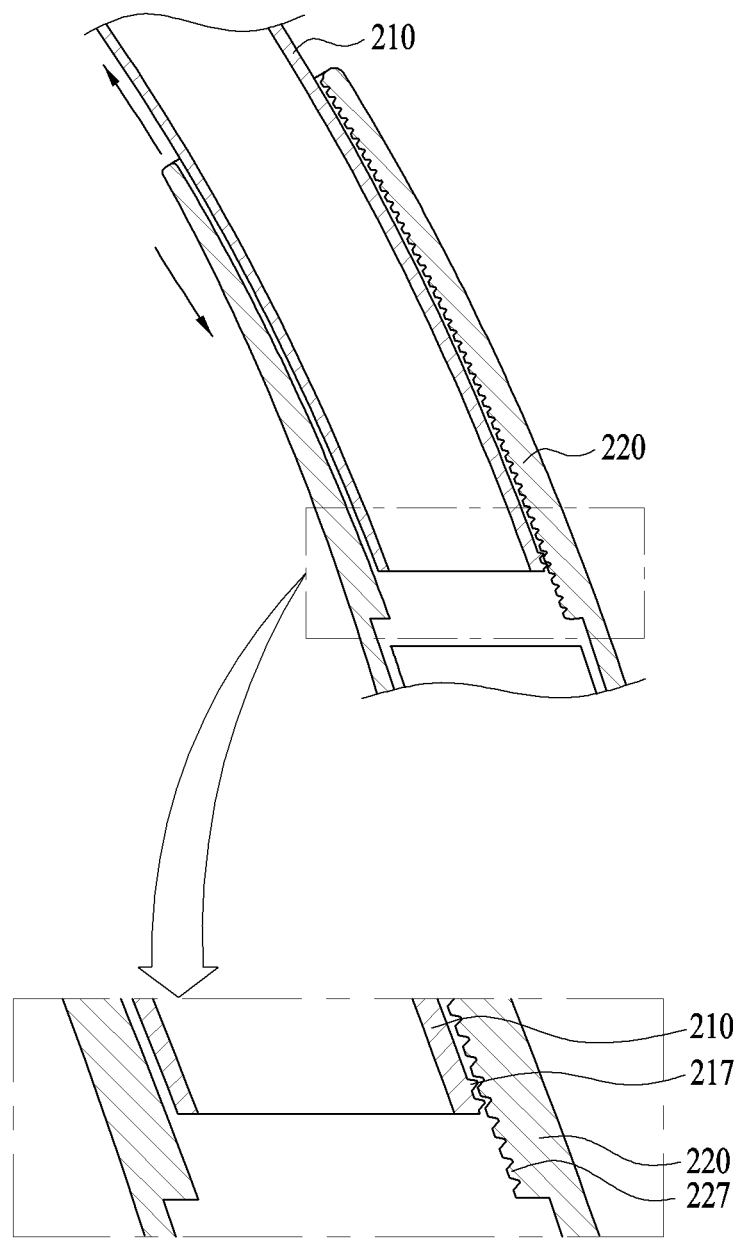
FIG. 12 is a cross-sectional view illustrating a length control protrusion and a length control groove for controlling a position between frames and a main body housing of an electronic device according to the present invention.

FIG. 12 is a cross-sectional view illustrating a length control protrusion 217 and a length control groove 227 for controlling a position between frames 211 and 212 and a main body housing 220 of an electronic device 200 according to the present invention. Although the length of the electronic device 200 may partially be changed through the frame control unit 300, the position of the main body housing 220 and the frames 211 and 212 may be changed as shown in FIG. 12 to control a full length of the electronic device 200.

The length control groove 227 formed at the inner side of the main body housing 220 and the length control protrusion formed at the other end of the frames 211 and 212 may be coupled to each other to be engaged with each other, whereby the position between the main body housing 220 and the frames 211 and 212 may be fixed. If the user applies a force of a predetermined size or more, the length control protrusion 217 is detached from the length control groove 227 and then coupled to a neighboring length control groove 227. In this way, the position between the housing and the frames 211 and 212 may be changed to control the length of the frames 211 and 212.

If the neck sizes are different per user, the angle between the frames 211 and 212 may be controlled by the frame control unit 300 and at the same time the position between the main body housing 220 and the frames 211 and 212 may be changed to provide the electronic device 200 which is wearable.

FIG. 13 is an exploded view illustrating a frame control unit 300 of an electronic device 200 according to the present invention. The frame control unit 300 arranged at the inner side of the middle case includes a hinge unit 351 provided with a first sawtooth 352 formed at the outer side, and a second sawtooth 353 formed at one side of the frames 211 and 212 and engaged with the first sawtooth 352.

A hinge has a disk shape and fixed to the middle housing 215, and the first sawtooth 352 is formed around the disk shaped hinge. The second sawtooth 353 is formed at one side of the first frame 211, and the first sawtooth 352 is arranged to form a convex curve. The second sawtooth 353 is formed at one side of the first frame 211 while forming a concave curve.

The first sawtooth 352 and the second sawtooth 353 have a slow slope, and if the user applies a force to the frames 211 and 212, the second sawtooth 353 engaged with the first sawtooth 352 moves to the first sawtooth 352 and moves little by little along the first sawtooth 352.

A frame hole 216 through which the pair of frames 211 and 212 pass is arranged symmetrically at both sides of the middle housing 215, and is formed to be greater in a rotational direction of the frames 211 and 212 than a section of the frames 211 and 212 such that the frames 211 and 212 move when they are rotated based on the hinge.

At this time, the frame control unit may further include a shutter cover 355 for covering an opened portion of the frame hole 216 to prevent the inside of the middle housing 215 from being seen. The shutter cover 355 is provided above and below the frames 211 and 212, and slidably moves in accordance with rotation of the frames 211 and 212. That is, the frame control unit may further include a first elastic member 356 moving like a sliding door and pushing the shutter cover 355 toward the frames 211 and 212 to always cover the space between the frames 211 and 212 and the frame hole 216.

The frame control unit may further include a flexible substrate 252 passing through the inside of the frames 211 and 212 and the inside of the middle housing 215 to electrically connect the main body housing 220 at one side with the main body housing 220 at the other side.

Figure 14:
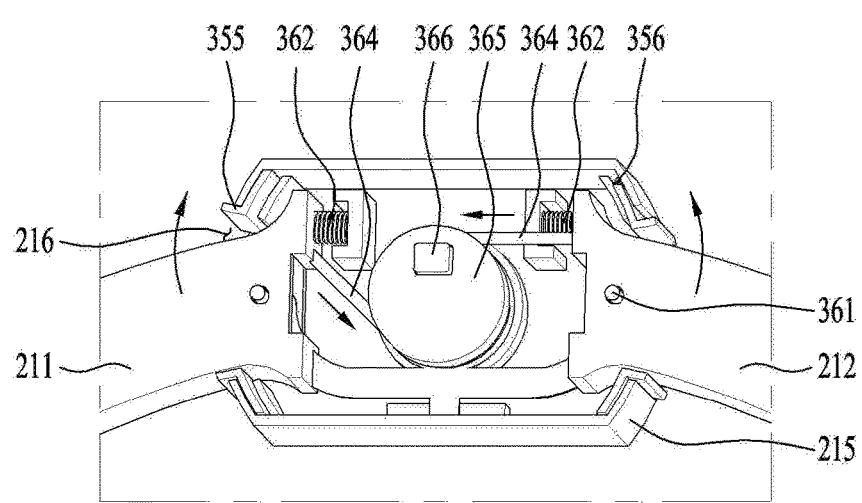
FIG. 14 is a perspective view illustrating a frame control unit of an electronic device according to the present invention.
Figure 15:
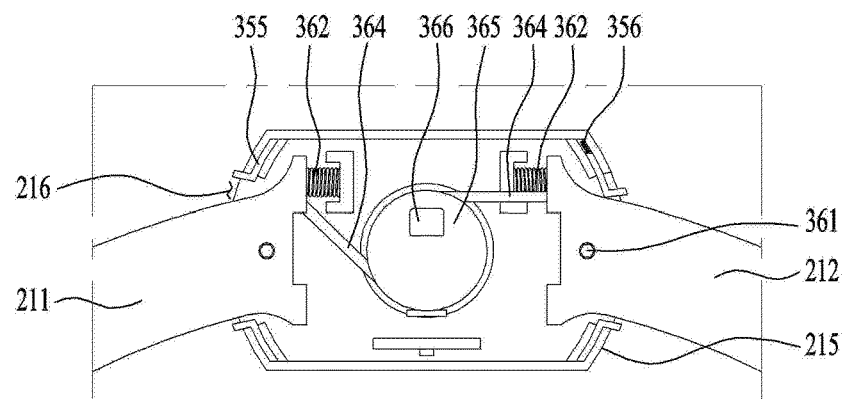
FIG. 15 is a perspective view illustrating a wheel shaft portion of FIG. 14.

FIG. 14 is a perspective view illustrating a frame control unit 300 of an electronic device 200 according to the present invention, and FIG. 15 is a plane view illustrating that a frame control unit 300 at a first state and a second state of an electronic device 200 of FIG. 14 is arranged. The frame control unit 300 of this embodiment includes a hinge unit 361 coupled to one end of the frames 211 and 212, a wheel 365 rotatably coupled to the middle housing 215, and a wire 364 having one end fixed to the wheel 365 and the other end coupled to one end of the frames 211 and 212, which is spaced apart from the hinge unit 361.

The wheel 365 arranged between one ends of the pair of frames 211 and 212 may be inserted to a wheel shaft 367 (FIG. 16) protruded from the middle housing 215 and then may be rotated based on the wheel shaft 367. One end of the wire 364 is fixed to the wheel 365 and the other end of the wire 364 is connected to the frames 211 and 212, and is wound on the outer circumference of the wheel 365 as the wheel 365 is rotated.

The hinge unit 361 rotatably fixes the frames 211 and 212 to the middle frames 211 and 212, and referring to FIG. 14, the hinge unit 361 is arranged at a center portion of one end of the frames 211 and 212, and the wire 364 is coupled to a position upwardly spaced apart from the hinge unit 361. As the distance between the hinge unit 361 and the wire coupling portion is increased, a movement displacement of the frames 211 and 212 occurs at a greater range.

As shown in FIG. 15(a), at the first state, the wire 364 is not wound on the wheel 365 and the distance between the wire coupling portion and the wheel 365 becomes maximum. As shown in FIG. 15(b), at the second state, the wire 364 is wound on the wheel 365 and the frames 211 and 212 are rotated based on the hinge, whereby the angle between the frames 211 and 212 is increased.

Figure 16:
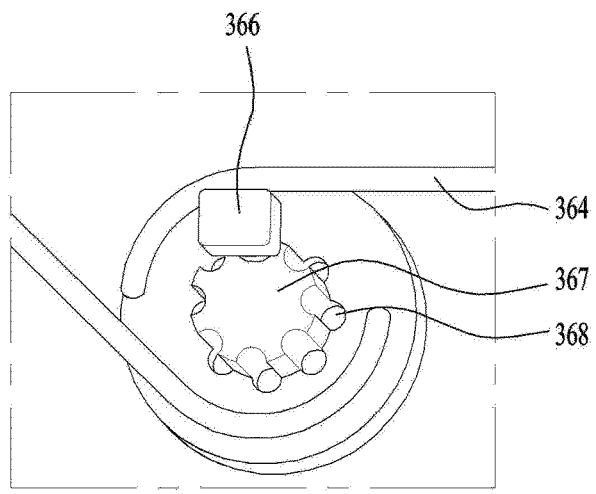
FIG. 16 is a plane view illustrating a frame control unit at a first state and a second state of an electronic device of FIG. 14.

FIG. 16 is a perspective view illustrating a portion of a wheel shaft 367 of FIG. 14. The wheel shaft 367 protruded from the middle housing 215 has a cylindrical shape, and a plurality of fixing grooves 368 may be formed along the circumference of the wheel shaft 365. Since the fixing groove 368 has a greater fixing force if the fixing groove 368 is spaced apart from the center of the wheel shaft 367, the fixing groove 368 may be formed to be partially arranged at the outer circumference of the wheel shaft 367 as shown in FIG. 16.

The wheel 365 may be provided with a fixing hole formed at a position corresponding to the fixing groove 368. If a plurality of fixing grooves 368 are provided, only one fixing hole may be formed. On the contrary, if one fixing groove 368 is provided, a plurality of fixing holes may be formed. As the wheel 365 is rotated based on the center of the wheel shaft 367, the fixing groove 368 overlapped with the fixing hole is varied, and a fixing pin 366 passing through the fixing hole and the fixing groove 368 restricts rotation of the wheel 365 by fixing the wheel 365 to the wheel shaft 367.

A second elastic member 362 may be interposed between the frames 211 and 212 and the middle housing 215 in the wire coupling portion. The second elastic member 362 is shrunk when the wire 364 is wound on the wheel 365 (the second state), and applies a pushing force to the frames 211 and 212 in a direction of the wire 364 unwound from the wheel 365.

When the fixing pin 366 is inserted to the fixing groove 368 and the fixing hole at the second state, the position of the frames 211 and 212 is fixed at the second state. If the fixing pin 366 is detached from the fixing groove 368 and the fixing hole, the wheel 365 is rotated in a direction of the wire 364 unwound from the wheel 365 by a force of the second elastic member 362 and the angle between the frames 211 and 212 becomes narrow, whereby the second state is switched to the first state. That is, switching from the first state to the second state needs the force of the user, but switching from the second state to the first state is performed automatically by elasticity of the second elastic member 362 if the fixing pin 366 is removed.

Figure 17:
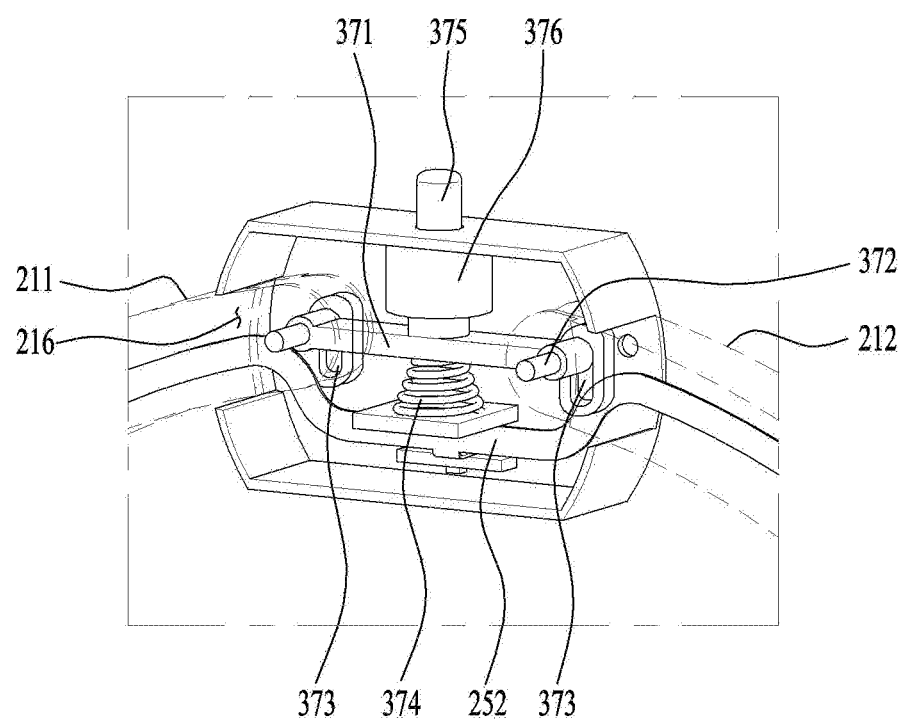
FIG. 17 is a perspective view illustrating a frame control unit of an electronic device according to the present invention.
Figure 18:
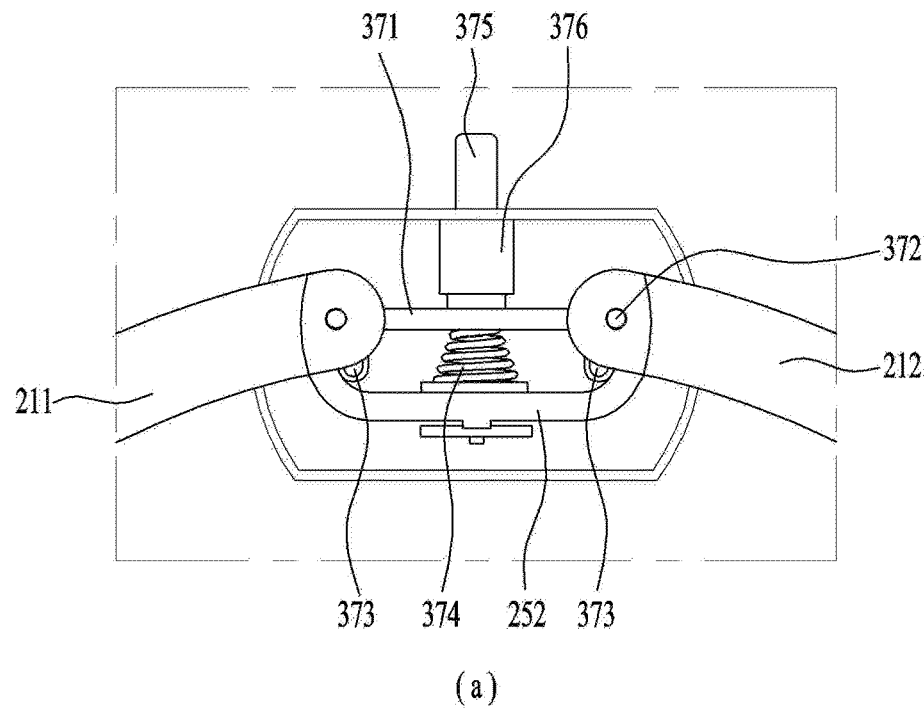
FIG. 18 is a plane view illustrating arrangement of a frame control unit at a first state and a second state of an electronic device of FIG. 17.
Figure 18:
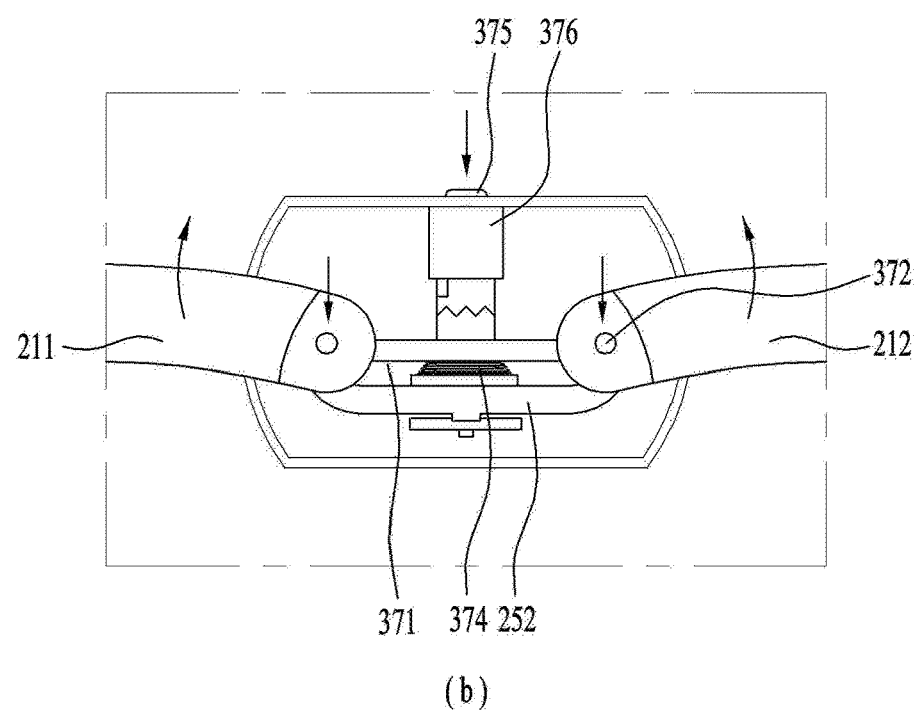

FIG. 17 is a perspective view illustrating a frame control unit 300 of an electronic device 200 according to the present invention, and FIG. 18 is a plane view illustrating arrangement of a frame control unit 300 at a first state and a second state of an electronic device 200 of FIG. 17. In this embodiment, a button 375 is pushed to control the angle between the pair of frames 211 and 212, and the frame control unit 300 includes a moving bracket 371 and the button 375.

One end of the button 375 is in contact with the moving bracket 371 and the other end of the button 375 is exposed to the outside of the middle housing 215. If the user pushes the other end of the button 375, the button 375 is inserted into the inner side of the middle housing 215 and pushes the moving bracket 371, whereby the moving bracket 371 moves to a lower side.

Both ends of the moving bracket 371 are coupled with the frames 211 and 212 by the hinge 372, and if the moving bracket 371 moves up and down, the hinge 372 is rotated and the angle between the frames 211 and 212 is controlled. The frame hole 216 of the middle housing 215, through which the frames 211 and 212 pass, has a size the same as a sectional area of the frames 211 and 212, the frames 211 and 212 do not move up and down in the portion of the frame hole 216.

As shown in FIG. 18, if one end of the frames 211 and 212 moves up and down along the moving bracket 371, the frame hole 216 serves as a support point, whereby the other end of the frames 211 and 212 move in an opposite direction of the moving direction of the one end of the frames 211 and 212.

The frame control unit may further include a guide slot 373 guiding up and down movement of the moving bracket 371 and restricting a moving range of the moving frames 211 and 212, and a guide protrusion (not shown) protruded from the moving bracket 371 and inserted into the guide slot 373.

In this embodiment, the guide protrusion may be protruded from portions of a pair of hinges 372 arranged at both ends of the moving bracket 371, and may be arranged at the other portion of the moving bracket 371. Although two guide slots 373 are formed in the drawing, one guide slot or two or more guide slots 373 may be provided. However, as shown in FIG. 17, if a pair of guide protrusions and a pair of guide slots 373 formed at a position corresponding to the guide protrusions are provided at both ends of the moving bracket 371, the moving bracket 371 may move stably.

The moving bracket 371 moves downwardly by means of a force for pushing the button 375, and upwardly returns by a third elastic member 374 arranged below the moving bracket 371. That is, if the user switches the first state to the second state by pushing the button 375 and then removes the force for pushing the button 375, the frames 211 and 212 return to the first state.

Since a user who has a thick neck size may feel inconvenience when wearing the electronic device, it is required to fix the electronic device at the second state. A stop protrusion 377 may be formed at an outer side of the button 375 such that the electronic device is fixed in a state that the button 375 is inserted, and a height control groove 378 may be formed at an inner side of a button housing for surrounding the outer circumference of the button 375.

Figure 19:
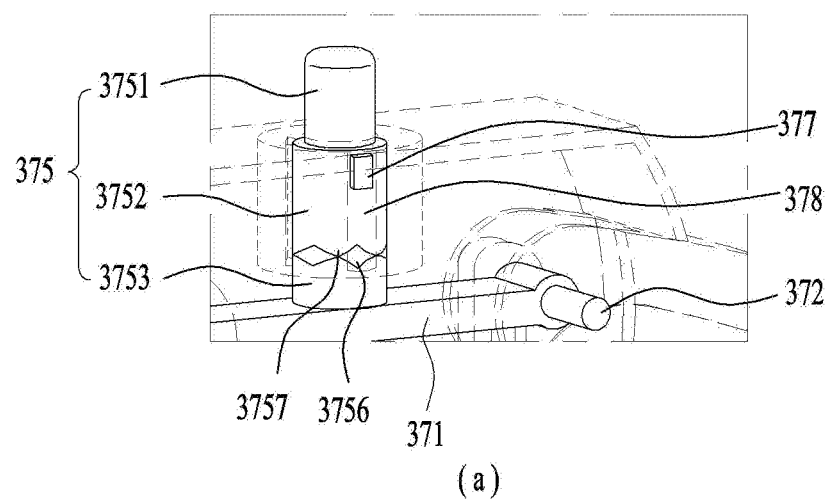
FIG. 19 is a perspective view illustrating a button at a first state and a second state of an electronic device of FIG. 17.
Figure 19:
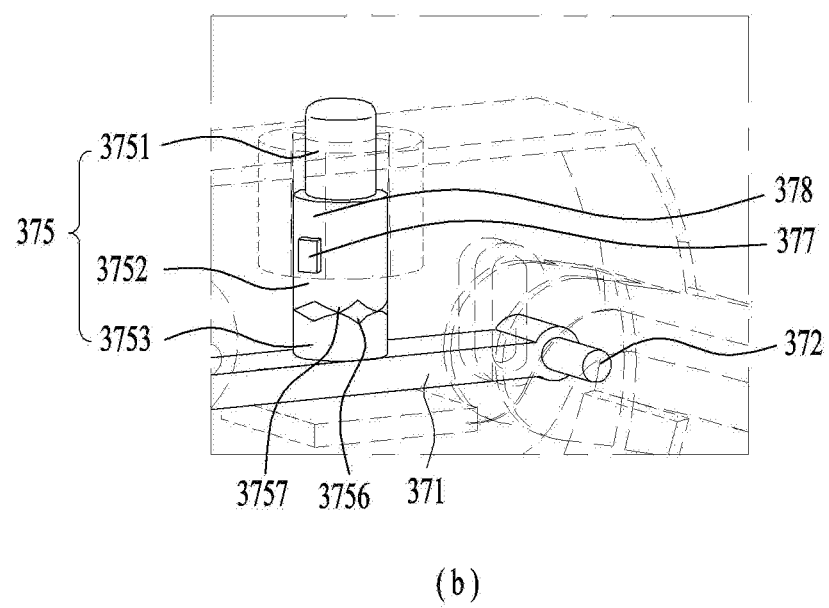
Figure 20:
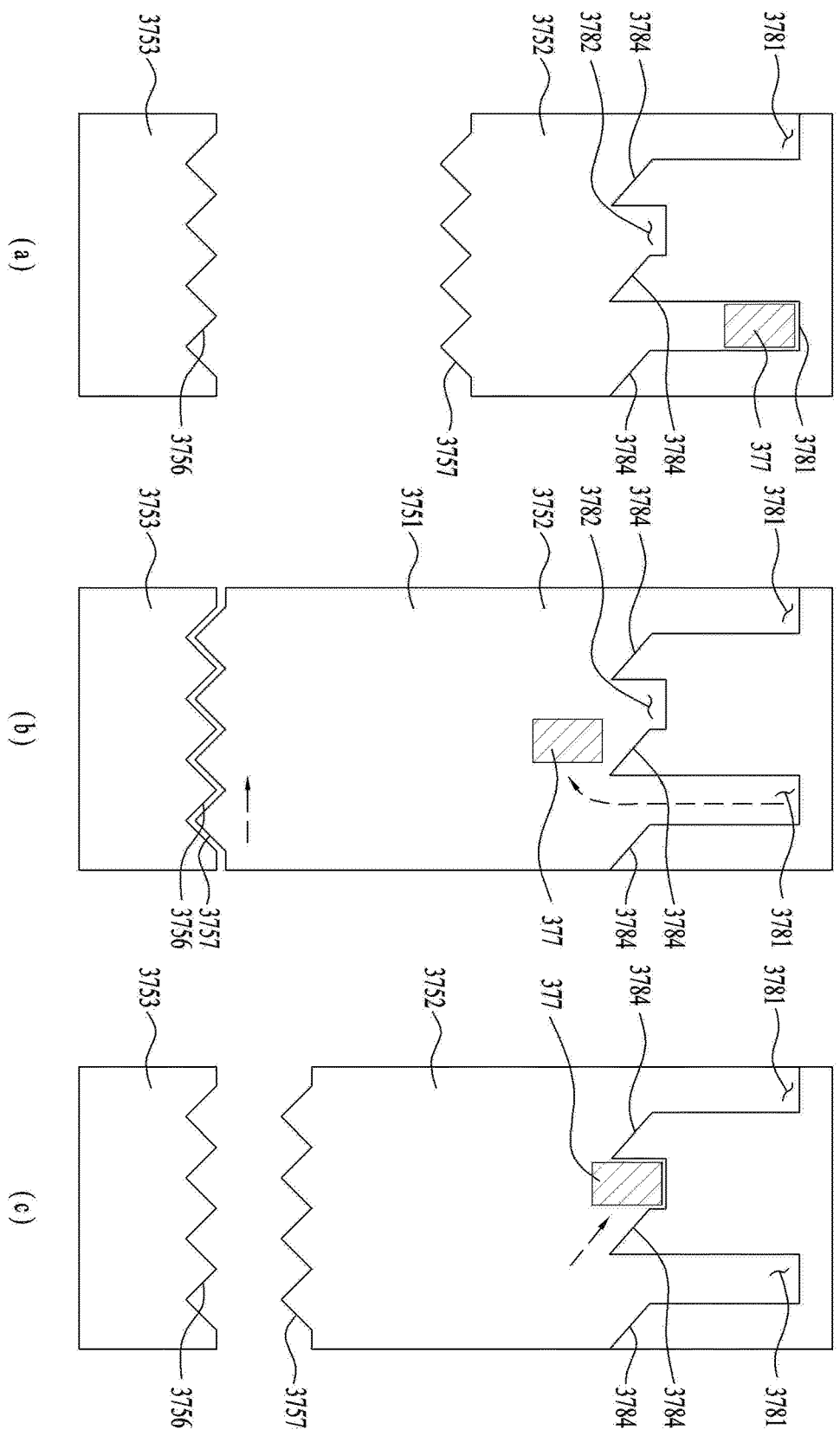
FIG. 20 is a plane view illustrating a sawtooth and a stop protrusion at an inner side of a button housing of FIG. 19.

FIG. 19 is a perspective view illustrating a button 375 at a first state and a second state of an electronic device 200 of FIG. 17, and FIG. 20 is a plane view illustrating a height control groove 378 and a stop protrusion 377 at an inner side of a button housing of FIG. 19.

As shown in FIG. 20(a), the height control groove 378 includes a plurality of stop grooves 3781 and 3782 having a shape opened downwardly and recessed upwardly and a width corresponding to that of the stop protrusion 377, and an inclined groove 3784 arranged between the stop grooves 3781 and 3782. The stop grooves 3781 and 3782 have their respective depths different from each other, wherein the depth may be two stages or more.

The stop grooves 3781 and 3782 may include a first stop groove 3781 in which the stop protrusion 377 is arranged when the button 375 is protruded to the outside of the middle housing 215 (the first state), a second stop groove 3782 in which the stop protrusion 377 is arranged when the button 375 is arranged at the inner side of the middle housing 215 (the second state), and may further include a third stop groove (not shown) having a depth lower than the first stop groove 3781 and deeper than the second stop groove 3782. The first stop groove 3781 and the second stop groove 3782, which have their respective heights different from each other, may repeatedly be formed at the inner circumference of the button housing.

The button 375 may include three pieces, that is, a first button 3751 inserted from or ejected to the outside, a second button 3752 fixed to an upper surface of the moving bracket 371, and a third button 3753 arranged at the inner side of the middle housing 215, surrounding the circumference of the first button 3751.

Referring to FIG. 20, the stop protrusion 377 formed at the outer side of the button 375 is rotated while moving along the height control groove 378 (moves in a left direction in the drawing). That is, the button 375 should also be rotated in a left direction. However, if the button 375 includes three pieces as above, the first button 3751 exposed to the outside and the second button 3752 fixed to the moving bracket 371 are not rotated, and the third button 3753 is only rotated.

If the stop protrusion 377 is arranged in the inclined groove 3784, the stop protrusion 377 moves to the stop grooves 3781 and 3782 by means of the third elastic member 374. However, in order that the stop protrusion moves from the stop grooves 3781 and 3782 to the inclined groove 3784, a third sawtooth 3756 of a crown shape may be formed on the upper circumference of the second button 3752 and a fourth sawtooth 3757 of a shape corresponding to the third sawtooth 3756 formed on the upper circumference of the second button 3752 may be formed on the lower circumference of the third button 3753.

If the user pushes the button 375, the stop protrusion 377 is detached from the first stop groove 3781, and the third sawtooth 3756 and the fourth sawtooth 3757 are in contact with each other as shown in FIG. 20(b). The fourth sawtooth 3757 and the third sawtooth 3756 move along the inclined surface, whereby the stop protrusion 377 is arranged in the inclined groove 3784, and if the user removes a force for pushing the button 375, the stop protrusion 377 is arranged in the second stop groove 3782 along the inclined groove 3784. The stop protrusion 377 moves from the second stop groove 3782 to the first stop groove 3781 in accordance with the same mechanism.

That is, if the user pushes the button 375 once, the button 375 is fixed in a state that the button 375 is inserted into the middle housing 215, whereby the button 375 is fixed at the second state that the angle between the frames 211 and 212 is increased. If the user pushes the button 375 once again, the button 375 is fixed in a state that the button 375 is detached from the middle housing 215, whereby the button 375 is fixed at the first state that the angle between the frames 211 and 212 becomes narrow.

Figure 21:
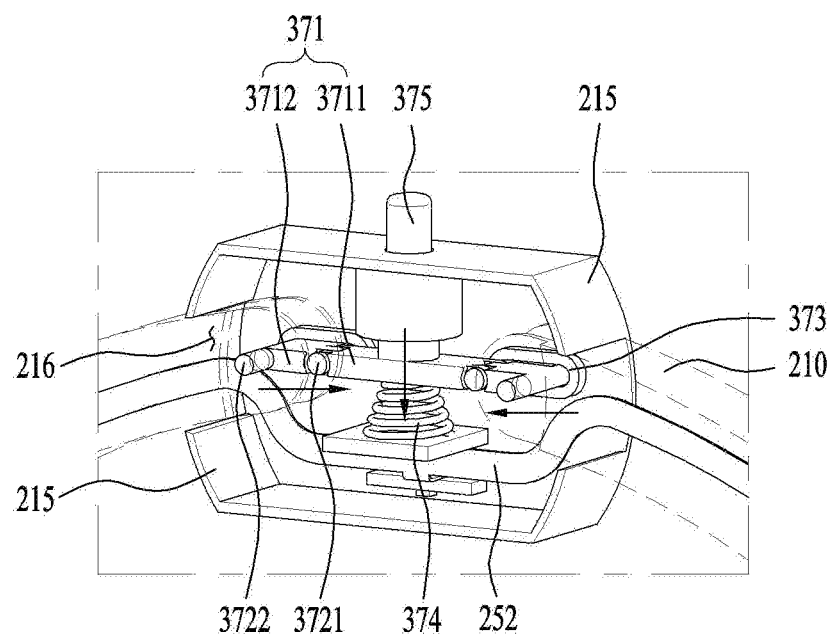
FIG. 21 is a perspective view illustrating a frame control unit of an electronic device according to the present invention.
Figure 22:
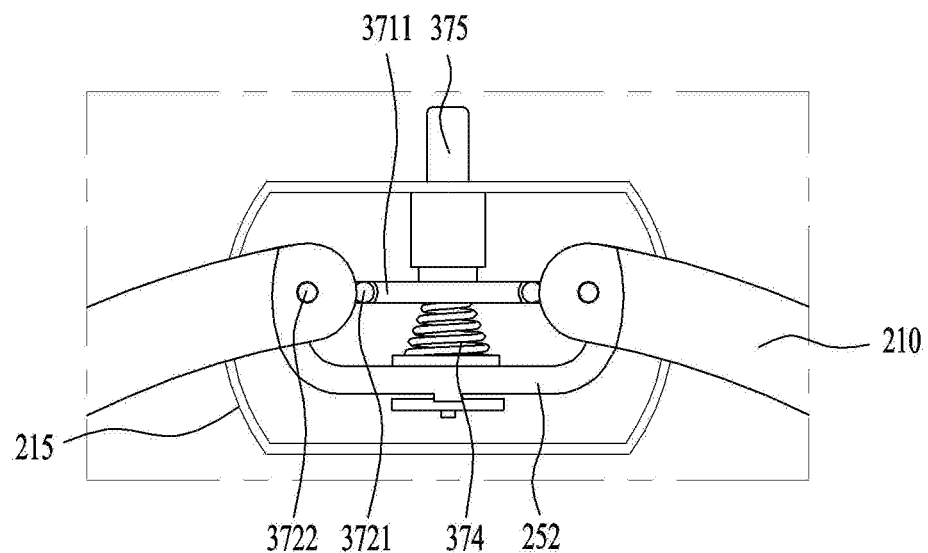
FIG. 22 is a plane view illustrating arrangement of a frame control unit at a first state and a second state of an electronic device of FIG. 21.
Figure 22:
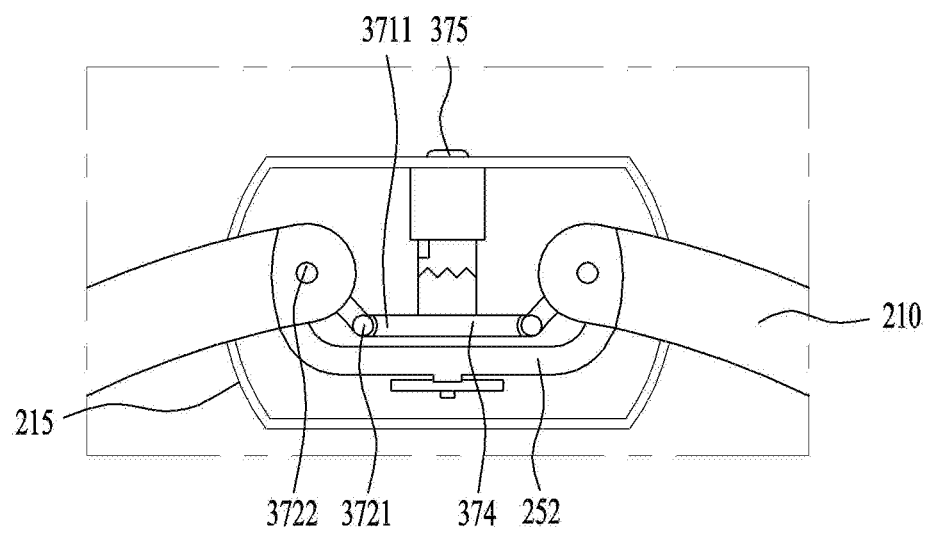

FIG. 21 is a perspective view illustrating a frame control unit 300 of an electronic device 200 according to the present invention, and FIG. 22 is a plane view illustrating a frame control unit 300 at a first state and a second state of an electronic device 200 of FIG. 21.

The moving bracket 371 of this embodiment includes a first moving bracket 3711 of which upper portion is in contact with the button 375 and lower portion is supported by the third elastic member 374, and a pair of second moving brackets 3712 connected to both ends of the first moving bracket 3711. One end of the second moving bracket 3712 is coupled with the first moving bracket 3711 by a first hinge 3721, and the other end of the second moving bracket 3712 is coupled with the frames 211 and 212 by a second hinge 3722.

These three link structures (the first moving bracket 3711 and the second moving brackets 3712) move differently from the aforementioned embodiment. As shown in FIG. 12, the first moving bracket 3711 moves up and down if the button 3745 is pushed, and the first hinge 3721 is rotated to deliver a force to the second moving bracket 3712. The second hinge 3722 of the second moving bracket 3712 moves in a horizontal direction, and pulls the frames 211 and 212 toward the inner side of the middle housing 215.

The frames 211 and 212 are obliquely extended from the middle housing 215 to a lower side, whereby the position of one end of the frames 211 and 212 connected with the second hinge 3722 and the position of the frame hole 216 formed in the middle housing 215 are different from each other in a height direction. The angle between the frames 211 and 212 is increased by the height difference as shown in FIG. 22(b), and the shape of the frames is changed to the second state.

At this time, a guide protrusion is formed in a position corresponding to the second hinge 3722 to guide horizontal movement of the second hinge 3722. The guide protrusion moves along the guide slot 373 extended in a horizontal direction and controls the angle between the frames 211 and 212.

Figure 23:
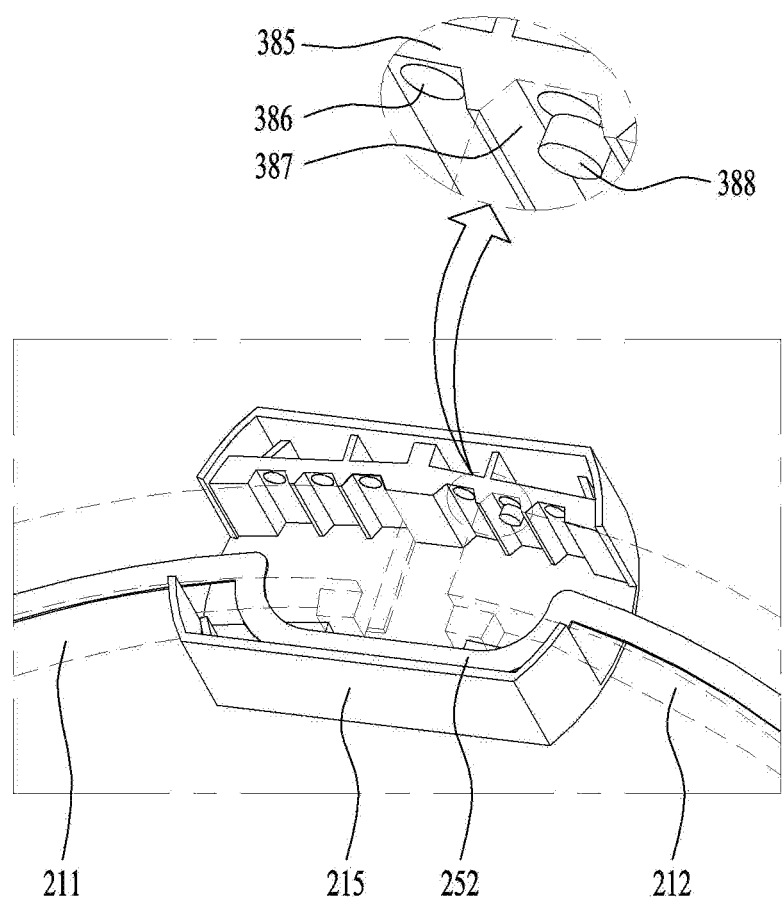
FIG. 23 is a perspective view illustrating a frame control unit of an electronic device according to the present invention.
Figure 24:
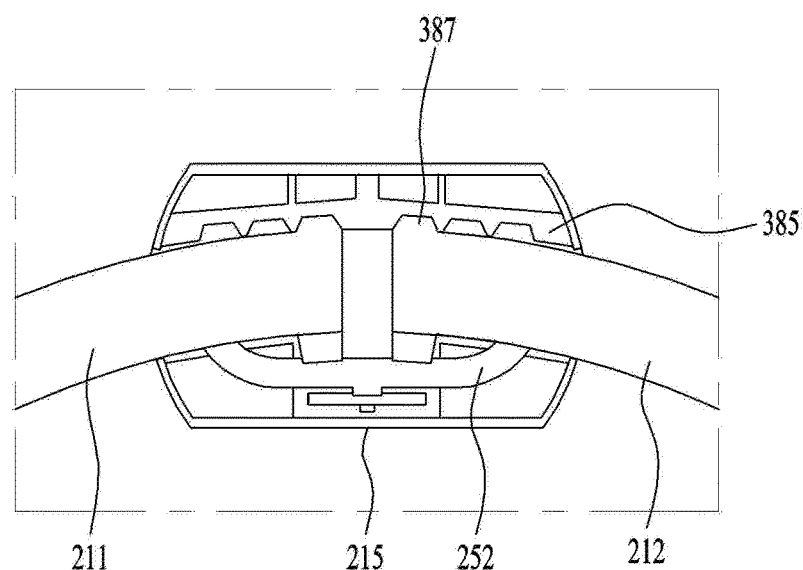
FIG. 24 is a plane view illustrating arrangement of a frame control unit at a first state and a second state of an electronic device of FIG. 23.
Figure 24:
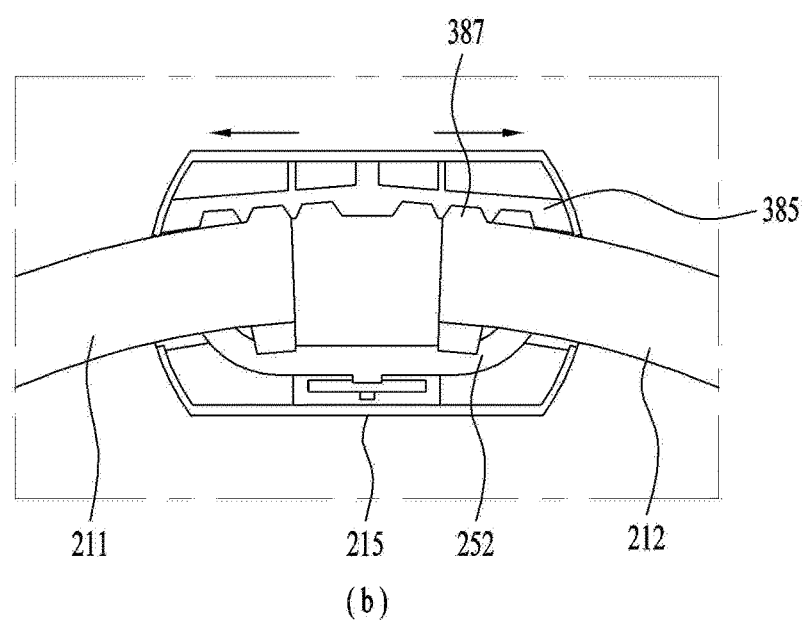

FIG. 23 is a perspective view illustrating a frame control unit 300 of an electronic device 200 according to the present invention, and FIG. 24 is a plane view illustrating a frame control unit 300 at a first state and a second state of an electronic device 200 of FIG. 23.

The frame control unit 300 of this embodiment controls a length of a band. That is, the frames 211 and 212 may be inserted into the middle housing 215 to reduce the length of the frames 211 and 212, and may be detached from the middle housing 215 to increase the length of the frames 211 and 212.

A first magnet 388 may be provided at one end of the frames 211 and 212 such that the frames 211 and 212 are fixed at a controlled length when the frames 211 and 212 are inserted or detached and their length is controlled. A second magnet 386 having an opposite polarity of the first magnet may be provided such that the frames 211 and 212 may be fixed to the middle frames 211 and 212 by a magnetic force. A plurality of second magnets 386 may be formed along an extension direction of the frames 211 and 212 as shown in FIG. 23.

If the user pulls the frames 211 and 212 toward the outside of the middle housing 215 or pushes the frames 211 and 212 toward the inner side of the middle housing 215 by means of a force greater than an attractive force of the first magnet 388 and the second magnet 386, the first magnet 388 is detached from the second magnet 386 and moves to another neighboring second magnet 386.

At this time, the second magnet 386 is arranged in a recessed portion 385 and the first magnet 388 is arranged in a protrusion portion 387 as shown in FIGS. 23 and 24 to guide movement of the first magnet 388 so that the first magnet 388 well sticks to the second magnet 386. The recessed portion 385 includes an inclined surface to guide the first magnet 388 to be coupled with the second magnet 386 at an exact position along the inclined surface. The protrusion portion 387 is formed to correspond to a shape of the recessed portion 385, and a wall between the recessed portions may prevent the frames 211 and 212 from unintentionally moving in a left and right direction inside the middle housing 215.

As described above, the electronic device 200 according to the present invention may include a frame control unit 300 that may vary the angle of the band 210 wound on a neck of a user, whereby it is convenient to detach or attach the electronic device 200 from or to the user and thus the user may stably fix the electronic device 200 when wearing the electronic device.

Also, if the frames 211 and 212 at one side move, the frames 211 and 212 at the other side also move symmetrically, whereby the shape of the band 210 is not distorted asymmetrically.

The above detailed description is to be considered in all respects as illustrative and not restrictive. The scope of the present invention should be determined by reasonable interpretation of the appended claims and all changes which come within the equivalent scope of the invention are included in the scope of the invention.

The invention claimed is:

1. An electronic device comprising:
a middle housing;
a pair of frames of which one ends are respectively coupled to each of both sides of the middle housing, wherein the pair of frames include a first frame and a second frame;
a main body housing coupled to the frames, in which electronic components are packaged; and
a frame control unit for controlling an angle or arrangement between the first frame and the second frame,
wherein the frame control unit includes a first rack gear extended from one end of the first frame and provided with a plurality of sawteeth, a second rack gear extended from one end of the second frame and provided with a plurality of sawteeth, and a gear module for controlling the first rack gear and the second rack gear to move the second rack gear symmetrically with the first rack gear when the first rack gear moves.

2. The electronic device according to claim 1, wherein the gear module includes a first pinion gear having a plurality of sawteeth engaged with sawteeth of the first rack gear, rotated when the first rack gear moves, and a second pinion gear having a plurality of sawteeth engaged with sawteeth of the second rack gear, rotated when the second rack gear moves.

3. The electronic device according to claim 2, further comprising a spur gear interposed between the first pinion gear and the second pinion gear and rotated to be engaged with the first pinion gear and the second pinion gear,
wherein the first rack gear is arranged below the first pinion gear, and the second rack gear is arranged above the second pinion gear.

4. The electronic device according to claim 3, wherein the first pinion gear and the second pinion gear include a drive gear rotated to be engaged with the first rack gear and the second rack gear, and a power transmission gear rotated based on the same shaft as that of the drive gear and rotated to be engaged with the spur gear, and
wherein the power transmission gear has a diameter greater than that of the drive gear, and the first rack gear and the second rack gear are arranged between the first pinion gear and the second pinion gear.

5. The electronic device according to claim 2, further comprising:
a first elastic member applying a force to the first frame in an outward direction of the middle housing;
a stopper engaged with the sawteeth of the first pinion gear to restrict rotation, moving the first frame by means of the first elastic member if the first frame is spaced apart from the first pinion gear;
a second elastic member providing an elastic force applied to the stopper such that the stopper is hung in the sawteeth of the first pinion gear; and
a restoring button applying a force to the stopper in an opposite direction of the elastic force of the second elastic member if it is pushed by a user.

6. The electronic device according to claim 2, wherein the first pinion gear and the second pinion gear are arranged in parallel at both sides and rotated in opposite directions by being engaged with each other, and the first rack gear and the second rack gear are arranged in the same position above or below the first pinion gear and the second pinion gear.

7. The electronic device according to claim 2, wherein the first pinion gear and the second pinion gear are rotated together based on the same shaft.

8. The electronic device according to claim 1, wherein the first rack gear and the second rack gear are curved in a curve shape.

9. The electronic device according to claim 1, further comprising:
a magnet arranged in the frames;
a plurality of hall sensors arranged to be spaced apart from one another in a length direction of the frames, the plurality of hall sensors generating a signal if the magnet is arranged at a predetermined distance; and
a controller changing a basic setup of the electronic device in accordance with the signal generated by the hall sensor,
wherein the frame control unit changes the angle or arrangement of the frames to a plurality of stages.

10. An electronic device comprising:
a middle housing;
a pair of frames of which one ends are respectively coupled to each of both sides of the middle housing, wherein the pair of frames include a first frame and a second frame;
a main body housing coupled to the frames, in which electronic components are packaged;
a frame control unit for controlling an angle or arrangement between the first frame and the second frame;
a body recognition sensor arranged on a surface of the middle housing, generating a signal when a user wears the electronic device;
a controller arranged in the main body housing, activating a function of the electronic device if the body recognition sensor generates the signal; and
a flexible substrate arranged in the frames, connecting the body recognition sensor with the controller.

11. The electronic device according to claim 1, further comprising:
a plurality of length control grooves formed at an inner side of the main body housing; and
a length control protrusion formed at an outer side of the other side of the frames and inserted into one of the plurality of length control grooves
wherein the length control protrusion moves to its neighboring length control groove if a force is applied to the frames.

12. The electronic device according to claim 1, wherein the frame control unit includes a hinge unit coupled to one end of at least one of the pair of frames and provided with a first sawtooth at an outside, the frames include a second sawtooth engaged with the first sawtooth, and a position of the second sawtooth engaged with the first sawtooth is changed when the frames are rotated based on the hinge unit.

13. The electronic device according to claim 1, further comprising:
frame holes formed at one side and the other side of the middle housing, into which one ends of the frames are inserted;
a shutter cover covering the frames at both sides of a first direction of the frame holes; and
a first elastic member applying a force for pushing the shutter cover to the frames.

14. The electronic device according to claim 1, wherein the frame control unit includes:
a hinge unit rotatably coupling one end of at least one of the pair of frames to the middle housing;
a wheel rotatably coupled to the middle housing;
a wire having one end fixed to the wheel and the other end coupled to one end of the frame at a position spaced apart from the hinge unit;
a second elastic member applying a pushing force opposite to a tensile force of the wire in contact with a wire coupling portion of the frame;
a fixing hole formed in the wheel;
a fixing groove formed in a position corresponding to the fixing hole in accordance with rotation of the wheel; and
a fixing pin inserted into the fixing hole and the fixing groove.

15. An electronic device comprising:
a middle housing;
a pair of frames of which one ends are respectively coupled to each of both sides of the middle housing, wherein the pair of frames include a first frame and a second frame;
a main body housing coupled to the frames, in which electronic components are packaged;
a frame control unit for controlling an angle or arrangement between the first frame and the second frame;

a moving bracket arranged at the inner side of the middle housing, including a hinge rotatably coupled to one end of the frame; and a button having one end which is in contact with an upper side of the moving bracket and the other end arranged at the outer side of the middle housing, and if a force is applied to the other end of the button and thus the button moves to the inner side of the middle housing, the moving bracket moves to a lower side, and the hinge changes the angle between the frames while being rotated.

16. The electronic device according to claim 15, further comprising:
   a guide slot formed at the inner side of the middle housing; and
   a guide protrusion protruded from the moving bracket, having an end inserted into the guide slot and moving along the guide slot when the moving bracket moves.

17. The electronic device according to claim 15, wherein the moving bracket includes:
   a first moving bracket which is in contact with the button;
   a second moving bracket having one end coupled to both ends of the first moving bracket by a first hinge and the other end coupled to one end of the frame by a second hinge;
   a guide slot formed at the inner side of the middle housing in a left and right direction; and
   a guide protrusion protruded from the second hinge, moving along the guide slot when the moving bracket moves.

18. The electronic device according to claim 15, further comprising:
   a button housing arranged at the inner side of the middle housing, surrounding the circumference of the button; and
   a height control groove formed at an inner side of the button housing, including a plurality of stop grooves having different heights in an up and down direction and a plurality of inclined grooves formed between the plurality of stop grooves,
   wherein the button includes:
   a first button having one side arranged at the inner side of the middle housing and the other side exposed to the outer side of the middle housing;
   a second button fixed to an upper surface of the moving bracket, having an upper circumference of a sawtooth shape;
   a third button surrounding a circumference of one side of the first button, having a lower circumference of a sawtooth shape corresponding to the sawtooth of the upper circumference of the second button; and
   a stop protrusion protruded to an outer side of the third button, moving from a first stop groove to a second stop groove through an inclined groove if a force is applied to the button.

19. The electronic device according to claim 1, further comprising:
   a first magnet arranged in the protrusion formed at one end of the frame;
   a recessed portion arranged at the inner side of the middle housing in a left and right direction; and
   a plurality of second magnets provided in the recessed portion, having polarities opposite to that of the first magnet,
   wherein the plurality of second magnets are arranged above the middle housing, the second magnet at a center portion being arranged below the second magnets of both sides.

* * * * *